United States Patent
Suwa

(10) Patent No.: US 6,855,997 B2
(45) Date of Patent: Feb. 15, 2005

(54) MASK, EXPOSURE METHOD, LINE WIDTH MEASURING METHOD, AND METHOD FOR MANUFACTURING SEMICONDUCTOR DEVICES

(75) Inventor: Kyoichi Suwa, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/729,339

(22) Filed: Dec. 5, 2000

(65) Prior Publication Data

US 2001/0021546 A1 Sep. 13, 2001

(30) Foreign Application Priority Data

Dec. 7, 1999 (JP) .......................................... 11-348196

(51) Int. Cl.⁷ ........................................ H01L 31/0232
(52) U.S. Cl. ........................ 257/435; 250/396; 355/40
(58) Field of Search ................................ 257/435, 797; 250/396; 355/40; 438/14, 29

(56) References Cited

U.S. PATENT DOCUMENTS

| 4,908,656 A | | 3/1990 | Suwa et al. .................... 355/53 |
| 4,931,830 A | * | 6/1990 | Suwa et al. .................... 355/71 |
| 5,666,205 A | * | 9/1997 | Tateno et al. ................ 356/401 |
| 5,750,294 A | * | 5/1998 | Hasegawa et al. ............. 430/22 |
| 6,094,256 A | | 7/2000 | Grodnensky et al. ......... 355/77 |
| 6,296,977 B1 | | 10/2001 | Kaise et al. ................... 430/30 |

FOREIGN PATENT DOCUMENTS

| JP | A 5-217872 | 8/1993 |
| JP | A 9-312251 | 12/1997 |

* cited by examiner

Primary Examiner—David Nelms
Assistant Examiner—Quoc Hoang
(74) Attorney, Agent, or Firm—Oliff & Berridge PLC

(57) ABSTRACT

A mask of the present invention has a circuit pattern to be transferred to a substrate via an optical system, and an inspection pattern to be used for a measurement of a line width of the pattern transferred to the substrate. By using such a mask, the time for proceeding from inspection to actual device exposure can be shortened.

16 Claims, 16 Drawing Sheets

FIG. 13A
FIG. 13B
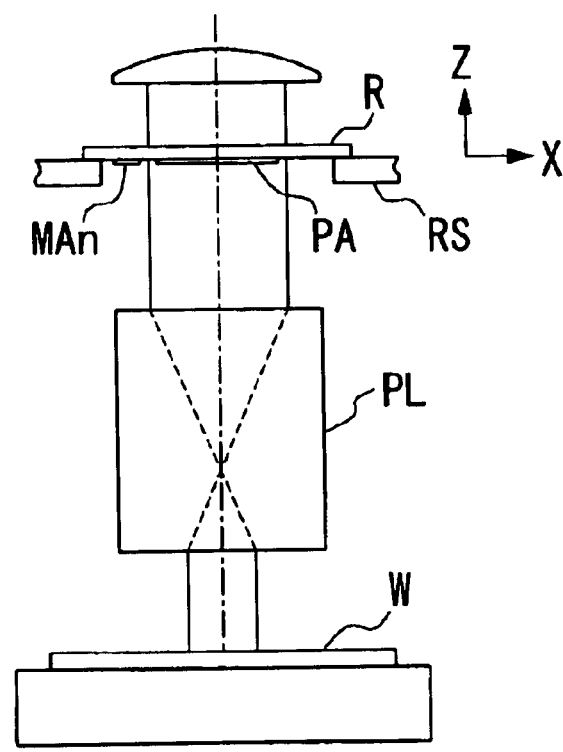
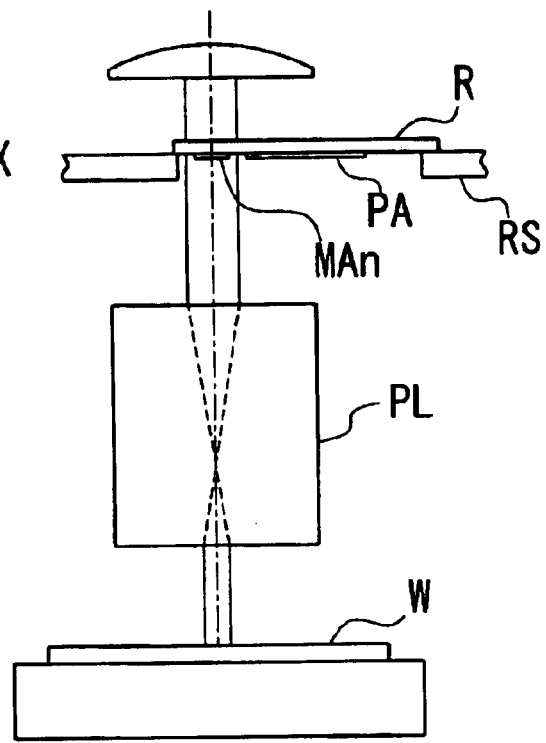

MASK, EXPOSURE METHOD, LINE WIDTH MEASURING METHOD, AND METHOD FOR MANUFACTURING SEMICONDUCTOR DEVICES

BACKGROUND OF THE INVENTION

1. Field of the Invention

The present invention relates to a mask for the manufacture of semiconductor devices such as semiconductor elements, liquid crystal display elements, image pick-up devices (CCDs etc.), or thin film magnetic heads and the like, and to an exposure method and a method of manufacturing semiconductor devices.

2. Background Art

In the photolithography process for manufacturing semiconductor devices, a circuit pattern is printed onto a photosensitive substrate, and various processes such as development and etching are performed on the substrate. The circuit pattern is formed on an original plate such as a photomask or reticle, and in general, the image thereof is transferred to a resist layer on the photosensitive substrate via an optical system of an exposure apparatus. With the yearly advancement in high integration of semiconductor devices, in the photolithography process, in order to manufacture even higher quality devices, inspection is made of the process conditions and the apparatus characteristics.

In this inspection, there is the case where the dimensions of the pattern actually formed on the process substrate (the line width etc.) are measured, and the optical characteristics of the exposure apparatus and the process conditions are verified. As a technique for measuring the dimensions of the pattern, heretofore the methods which are generally adopted are; a method of observing the pattern image with an ITV camera via an optical microscope, a method of obtaining the pattern edge of the image using a laser spot light, and a so called SEM method which uses intensity of secondary electrons generated by an electron beam.

However, with abovementioned methods, in order to measure the pattern dimensions, there are the following problems. At first, with the method using an ITV camera and the method using a laser spot light, since there is a light diffraction phenomena, then for example if only the width of one line pattern image is simply detected, there is naturally a limit to the resolution. In particular, with the laser spot method, since the spot size does not fall below the diffraction limit, measurement is not possible for line widths below the spot size. Furthermore, in the method using an ITV camera, although operation is simple, the characteristics of the object lens of the microscope for enlarged viewing of the pattern image, influence the direct resolution or measurement accuracy. On the other hand, in the SEM method, in order to measure the lens image after placing the wafer as a sample into a high vacuum chamber, the operation for preparing the measurement conditions such as the exhaust operation takes time, so that there is a reduction in measurement throughput.

Therefore, the present applicant, in U.S. Pat. No. 4,908, 656 (corresponding to Japanese Unexamined Patent Application, First Publication No. Hei 2-31142), has proposed a method for measuring the pattern dimensions by doubly exposing the photosensitive substrate with a substantially linear inspection pattern (a dark part or a light part on the mask or reticle) so as to intersect at a predetermined intersection angle, and using the image such as a wedge-shaped image formed on the substrate. According to this technique, by forming the doubly exposed image, then compared to the case where an image which has been formed by only one exposure is directly measured, it is possible to simply measure the dimensions of the pattern with good reproduction and to a high accuracy. Furthermore, with this technique, also by using the ITV camera or the lens spotlight etc., the pattern dimensions can be measured to a high accuracy.

However, with this technique, at the time of measuring the pattern dimensions, a mask (reticle) having an inspection pattern exclusively for inspection is used. Therefore at the time of actually manufacturing the semiconductor device, it is necessary to change from the inspection mask to a mask having a circuit pattern for actual device manufacture. In the mask exchange operation, there are many operations requiring a comparatively long time such as, examining the front and rear surface of the new mask for foreign objects, and accurately positioning and mounting this mask on the mask stage. Therefore, there is the problem that a large amount of time is required from inspection until shifting to actual device exposure.

SUMMARY OF THE INVENTION

The present invention takes into consideration the above situation, and the object of the present invention is to provide a mask, an exposure method, a line width measuring method and a method of manufacturing semiconductor devices which can shorten the time from inspection until shifting to actual device exposure.

In order to solve the above problems, the mask of the present invention comprises a circuit pattern to be transferred to a substrate via an optical system, and an inspection pattern to be used for a measurement of a line width of a pattern transferred to the substrate.

According to such a mask, since the mask has both the circuit pattern and the inspection pattern, both the step using the circuit pattern and the step using the inspection pattern are possible using the same mask. Consequently, the time heretofore required for mask exchange between steps is omitted, enabling the time required for shifting between processes to be shortened.

The inspection pattern may comprise a first measurement pattern, a second measurement pattern to be superimposed on an image of the first measurement pattern, and an extraction pattern to be used for an extraction of a predetermined image from a superimposed image of the first measurement pattern and the second measurement pattern.

In this case, by superimposing a plurality of the patterns and transferring this to the photosensitive substrate, a predetermined image can be extracted. Therefore, unnecessary pattern images can be deleted, and line width can be accurately measured using the extracted image. Moreover, since by forming a predetermined image by superimposing linear patterns, the line width of the pattern is indicated enlarged, line width can be simply and accurately measured.

The first measurement pattern and the second measurement pattern may comprise a plurality of linear patterns which are parallel to each other, and the extraction pattern may be formed in a shape for extracting at least one approximate rhombic shape image from an image to be formed by superimposing the first measurement pattern and the second measurement pattern, so as to intersect each other at a predetermined angle.

In this case, since an approximate rhombic shape image is extracted, line width can be accurately measured without being influenced by other superimposed images.

The measurement pattern may be formed in a separate area to the circuit pattern area in which the circuit pattern is formed. In this case, since the measurement pattern is formed in a separate area to the area formed with the circuit pattern, the shape and position of the measurement pattern can be flexibly designed. Moreover, it is easy to form common measurement patterns on a plurality of masks.

The measurement pattern may be a part of the circuit pattern. In this case, since the measurement pattern is a part of the circuit pattern, there is no need to maintain a space for the measurement pattern, enabling the pattern to be efficiently formed on the mask.

A line width of the measurement pattern may correspond to a line width of the circuit pattern. In this case, since the line width of the measurement pattern corresponds to the line width of the circuit pattern, by measuring the line width of the measurement pattern, the line width of the circuit pattern actually formed on the substrate can be easily measured. Furthermore, if the line width of the measurement pattern is measured using the superimposed image, then even the smallest line width of a fine circuit pattern can be reliably measured.

The exposure method according to the present invention has; a measurement step of measuring a line width of a pattern transferred to a substrate, using an inspection pattern formed on a mask, and an exposure step of transferring a circuit pattern of a mask to the substrate via an optical system.

According to the exposure method, the mask used in the exposure step can also be used as is in the measurement step. Consequently, mask exchange between the measurement step and the exposure step is unnecessary, and the time for shifting from the inspection to the actual device exposure can be shortened. Furthermore, since the same mask is used in both the measurement step and the exposure step, there is no occurrence of an error in the optical characteristics attributable to solid body differences of the masks between the two steps.

The exposure conditions of the substrate may be adjusted based on a line width of the pattern measured in the measurement step. In this case, since the exposure conditions are adjusted based on the line width of the measured pattern, exposure accuracy of the actual device can be improved.

A line width measurement method of the present invention comprises a first step of projecting a first linear pattern formed with a predetermined line width onto a predetermined surface, a second step of projecting a second linear pattern formed with a line width different to that of the first linear pattern, onto an image of the first linear pattern projected onto the predetermined surface, so as to intersect each other at a predetermined angle thereto, and a third step of measuring a dimension of an overlapped portion of the first linear pattern and the second linear pattern.

According to this line width measuring method, by overlapping the two linear patterns at a predetermined angle, the line width at the overlapped portion is indicated enlarged. Therefore, even with a fine line width, the line width can be reliably measured.

The first through third steps may be used in measuring a minimum line width of a circuit pattern projected onto a photosensitive substrate via an optical system, and one line width of the first linear pattern and the second linear pattern may be commensurable with the minimum line width of the circuit pattern, and an other line width of the first linear pattern and the second linear pattern may be thicker than the one line width.

In this case, by having the line width of one linear pattern thick, the line with of the other linear pattern which is commensurable with the minimum line width of the circuit pattern is indicated further enlarged at the overlap portion. Therefore even the minimum line width of a fine circuit pattern can be reliably measured.

The mask of an other aspect of the present invention is one formed with a measurement pattern for a measurement of a line width of a circuit pattern transferred onto a substrate via an optical system, wherein the measurement pattern has a first linear pattern formed with a predetermined line width, and a second linear pattern superimposed on an image of the first linear pattern, and formed with a line width different to that of the first linear pattern.

According to such a mask, since this mask has a first and second linear pattern overlapping each other and formed with different line widths as the measurement pattern for measuring the line width, the line width is indicated enlarged at the overlapping portions at the time of measurement. Therefore, even with a fine line width, line width can be reliably measured.

The circuit pattern may be formed in an area different from an area in which the first linear pattern and the second linear pattern are formed. In this case, since the circuit pattern is formed in an area different from the area in which the first and second linear patterns are formed, the circuit pattern and the measurement pattern may be respectively formed easily on the same mask.

An exposure method according to another aspect of the present invention comprises an exposure step of transferring a circuit pattern of any of the aforementioned masks onto a substrate via an optical system, and a measurement step of measuring prior to the exposure step, using the first linear pattern and the second linear pattern which are formed on the mask used in the exposure step, a line width of a pattern which is transferred to the substrate.

According to this exposure method, since the line width of the pattern transferred to the substrate is measured prior to the exposure step using the first and second linear patterns formed on the mask, then optimum exposure conditions can be determined based on the results of the measured line width, so that an improvement in exposure accuracy can be easily achieved.

A method of manufacturing semiconductor devices according to another aspect of the present invention has; an exposure step of transferring a circuit pattern of any of the aforementioned masks onto a substrate via an optical system, and a measurement step of measuring prior to the exposure step, using the first linear pattern and the second linear pattern which are formed on the mask used in the exposure step, a line width of a pattern which is transferred to the substrate.

According to this method of manufacturing semiconductor devices, since the mask used in measurement of the pattern line width is used as is in the exposure step of manufacturing the actual device, it is possible to shift within a short time from the measurement step to the manufacturing step. Moreover, by adjusting the exposure conditions based on the results for the line width measurement, accuracy of the actual device can be improved.

BRIEF DESCRIPTION OF THE DRAWINGS

FIG. 13A and FIG. 13B are views showing the configuration of a projection exposure apparatus of a step-and-repeat system.

DETAILED DESCRIPTION OF THE PREFERRED EMBODIMENTS

Figure 1A:
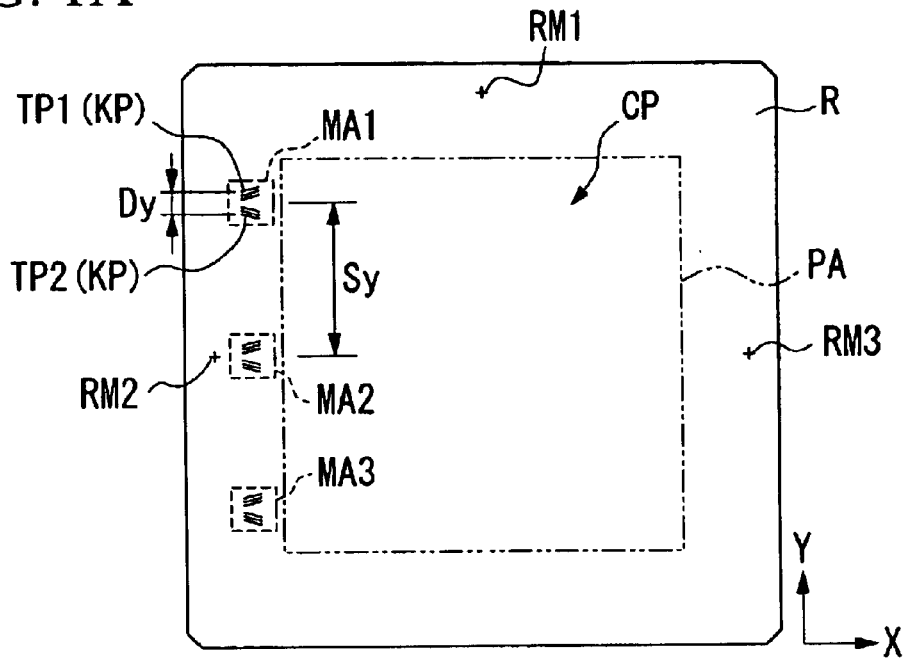
FIG. 1A through FIG. 1C are plan views showing a first embodiment of a mask according to the present invention.
Figure 1B:
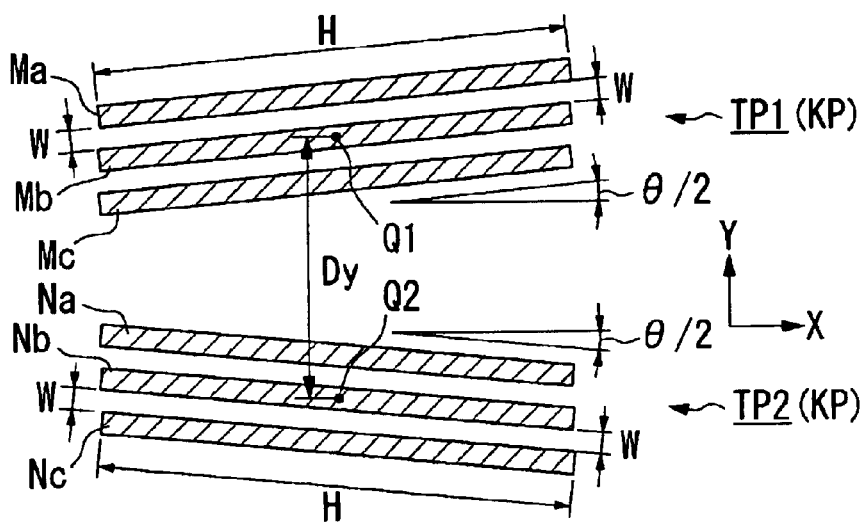
Figure 1C:
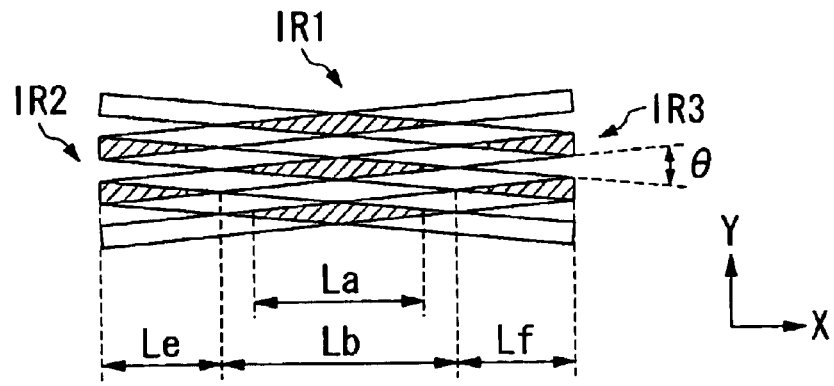

Hereunder is a description of preferred embodiments of the mask according to the present invention. FIG. 1A through FIG. 1C show a first embodiment of a mask according to the present invention. On this mask R (or reticle), a circuit pattern CP for manufacturing an actual device is formed in a circuit pattern area PA, and inspection patterns KP are formed in a mark area MA separated from the circuit pattern area PA. The circuit pattern CP and the inspection patterns KP are transferred onto a glass plate, being the mother plate of the mask R based on measurement data, by means of for example a pattern generator or an apparatus referred to as an EB exposure apparatus, and are formed as either light transmitting portions or shading portions (chromium film etc.). According to this embodiment, the description is for where the circuit pattern area PA and the mark areas MA are formed as light transmitting portions, and the circuit pattern CP and the inspection patterns KP are formed on these light transmitting portions as shading portions (chromium film etc.). The respective areas PA and MA may be formed as shading portions, and the respective patterns CP and KP may be formed as light transmitting portions. Moreover, the circuit pattern area PA may be formed as a light transmitting portion, and the circuit pattern CP may be formed on this light transmitting portion as an shading portion, and the mark areas MA may be formed as shading portions, and the inspection patterns KP may be formed on these shading portions as light transmitting portions. Furthermore, the circuit pattern area PA may be formed as an shading portion, and the circuit pattern CP may be formed on this shading portion as a light transmitting portion, and the mark areas MA may be formed as light transmitting portions, and the inspection patterns KP may be formed on these light transmitting portions as shading portions. Moreover, reference symbols RM1, RM2 and RM3 in the figure denote alignment marks used in positioning (alignment). The location of the circuit pattern CP and the inspection patterns KP is determined based on these alignment marks RM1, RM2 and RM3.

In this embodiment, at three locations outside of the left hand edge in the figure, of the circuit pattern area PA are formed mark areas MA1, MA2 and MA3 at a pitch Sy in the Y-direction. The mark areas are not limited to three locations, and may be at one location, at two locations, or at four or more locations. The inspection pattern KP comprises two patterns, namely a linear pattern group TP1 rising to the right with respect to the X-axis in the figure, and a linear pattern group TP2 rising to the left with respect to the X-axis. Furthermore, these linear pattern groups TP1 and TP2 are formed in a line-and-space form (the pitch is not limited to 1:1) of a previously determined line width, with the length in the lengthwise direction (approximately in the X-direction) of around several tens of microns to several hundred microns. The line widths of the receptive patterns of the linear pattern groups TP1 and TP2 are preferably made to correspond to the minimum line width of the pattern of the actual device to be formed in the circuit pattern area PA. Furthermore, with this embodiment, respective identical linear pattern groups TP1 and TP2 are formed in the mark areas MA1, MA2 and MA3. However the invention is not limited to this, and as described later, at least one of; the number, the line width, or the pitch of the linear patterns formed in the mark areas MA1, MA2 and MA3, may be changed. For example, the number of patterns of the linear pattern groups TP1 and TP2 of the mark area MA1 may be each made one, and the line width of these patterns made to correspond to the line width of an isolated pattern formed in the circuit pattern area PA, and the line width of the patterns of the linear pattern groups TP1 and TP2 of the mark areas MA2 and MA3 made to correspond to the pitch of a line-and-space pattern formed comparatively numerously in the circuit pattern area PA.

FIG. 1B is a plan view showing the detailed shape of the linear pattern groups TP1 and TP2 inside the respective mark areas MA1, MA2 and MA3 (referred to overall as mark area MA). Here, the linear pattern groups TP1 and TP2 correspond to the line-and-space pattern numerously formed in the circuit pattern CP. With the linear pattern group TP1, three linear opaque patterns (measurement patterns) Ma, Mb and Mc of widths w and length H, are arranged in parallel to each other at a spacing W and inclined upwards to the right at an angle $\theta/2$ with respect to the X-axis. With the linear pattern group TP2, three linear opaque patterns (measurement patterns) Na, Nb and Nc of width w and length H, are arranged in parallel to each other at a spacing W and inclined upwards to the left at an angle $\theta/2$ with respect to the X-axis. In the two linear pattern groups TP1 and TP2, the number of measurement patterns is preferably equal to each other. Furthermore, the central position of the linear pattern groups TP1 and TP2 coincides with center points Q1 and Q2 in the lengthwise direction of the respective measurement patterns Mb and Nb. In one of the mark areas, the X-coordinate value coincides, and has a difference of Dy in the Y-coordinate value.

Next is a description of an embodiment of an exposure method performed using the abovementioned mask R. However, prior to this, a description is given of an exposure apparatus ideally used for this embodiment.

Figure 2:
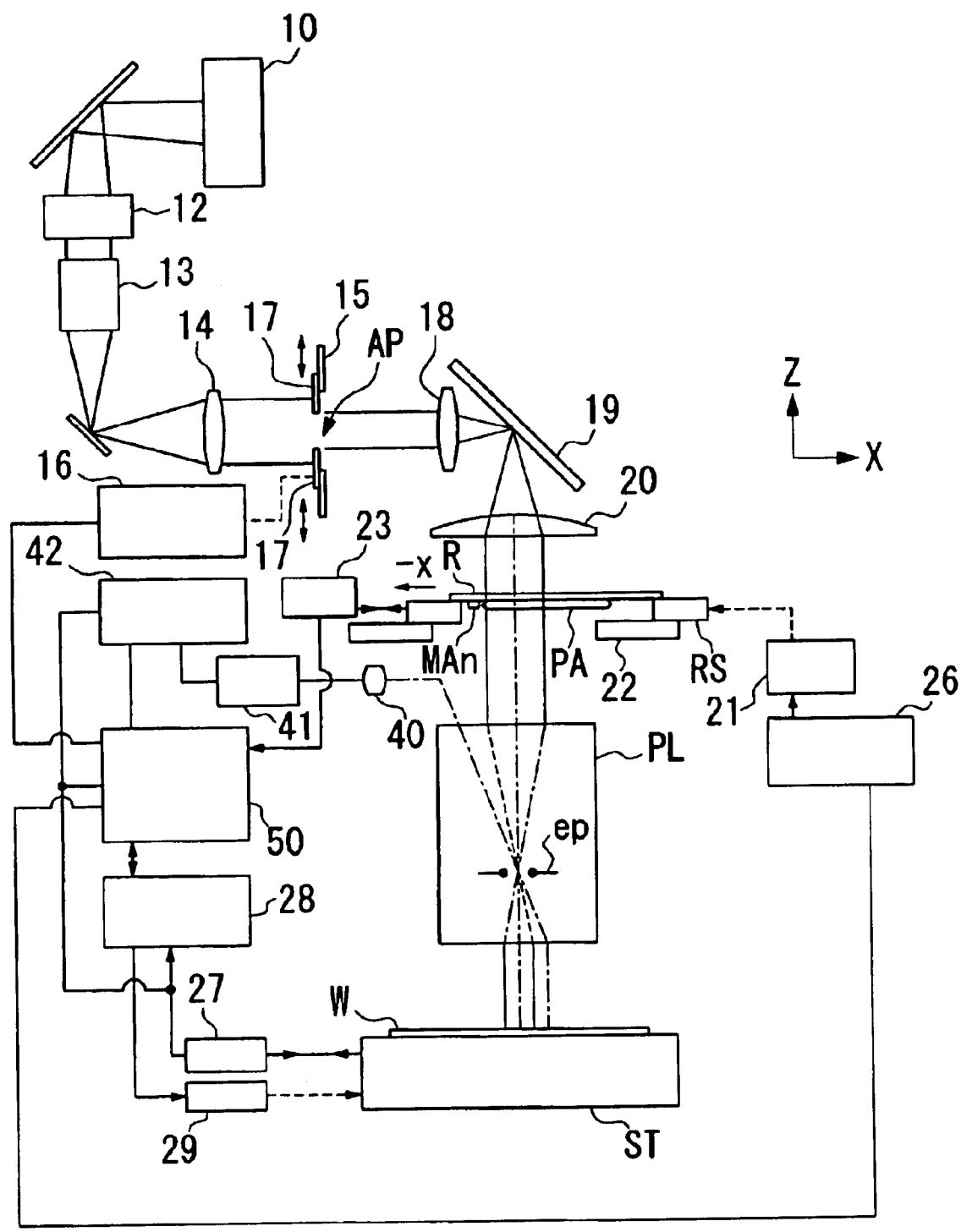
FIG. 2 is a view showing a configuration example of a projection exposure apparatus of a step-and-scan type.

FIG. 2 is a view showing the configuration of a reduction projection exposure apparatus used in semiconductor device manufacture applicable to the present embodiment. This exposure apparatus is a so called step-and-scan type which, while respectively scanning a mask (reticle) R and a wafer W simultaneously at respective predetermined speeds, scanning exposes a pattern image on one shot area of the wafer W, and repeats this scanning operation by steppingly moving the wafer W.

Exposure light from an exposure light source 10 is made uniform in intensity by an optical system 13 having an optical integrator or the like, and by means of a lens system 14, passes through a field stop mechanism 15. For the exposure light, for example KrF excimer laser light, ArF excimer laser light, a copper vapor laser, the higher harmonics of a YAG laser, or an emission line (g-line, i-line etc.) of an ultraviolet region of an extra-high tension mercury lamp is used. According to the field stop mechanism 15, by means of an edge of a movable blade 17 moved by a drive system 16, the shape of an aperture AP is optionally regulated. The shape of the aperture AP with the present example is determined as a rectangular shape which is contained inside a circular image field of the projection optical system PL. Illumination light which passes through the aperture AP of the field stop mechanism 15, is irradiated at a uniform illumination distribution onto the reticle R, via an illumination optical system comprising a lens system 18, a mirror 19, and a main condenser lens 20.

The reticle R is held on a reticle stage RS with the circuit pattern area facing downward. The image of the aperture AP formed by the movable blade 17 of the field stop mechanism 15, is imaged as a rectangular slit shape illumination area on the lower face of the reticle R being the pattern formation face. The pattern inside the illumination area is reduced by a projection magnification $\beta$ ($\beta$ is for example ⅕) via the projection optical system PL, and imaged inside one shot area on the wafer W.

The reticle R is held on the reticle stage RS and the reticle stage RS is scanned in one dimension in the X-direction by a reticle stage drive system 21, and is supported by a column 22 so as to be incrementally moved in the Y-direction and the rotation direction (θ-direction). Here, the direction parallel with the optical axis of the projection optical system PL is the Z-direction, and the relative scanning direction within a plane perpendicular to the optical axis of the reticle R and the illumination area (the direction parallel with the page) is the X-direction, and the direction perpendicular to this is the Y-direction. The two dimensional position of the reticle stage RS is successively detected by a laser interferometry type length measuring machine (referred to hereunder as an interferometer) 23.

The wafer W is mounted on the wafer stage ST which is movable in two dimensions, namely the X and Y-directions. The wafer stage ST is operated so that the wafer W is stepped by predetermined amounts in the X-direction and the Y-direction within a plane perpendicular to the optical axis of the projection optical system PL, and the pattern image of the reticle R is transferred to each shot area on the wafer W. Furthermore, with the wafer stage ST, the two dimensional coordinates are successively detected by the interferometer 27, and based on these coordinate values, the wafer control circuit 28 servo controls X and Y drive motors 29. Here, the movement speed Vst in the X-direction of the wafer stage ST at the time of exposure (scanning exposure) is $\beta$ (for example ⅕) times the speed Vrs of the reticle stage RS.

Moreover, in the exposure apparatus of this embodiment, a TTL alignment system 41 is provided for detecting alignment marks or the resist image (latent image) on the wafer W. This TTL alignment system 41 (detection system) shines a beam of a non photosensitive wavelength of He—Ne laser light or the like into the projection optical system PL via an object lens 40 to form a spot light (slit shape or minute circular shape) on the wafer W, and photoelectrically detects optical information from the mark (resist image) on the wafer W via the projection optical system PL, and the object lens 40. In the case where the lens image is actually detected, by scanning the wafer W (wafer stage ST) in one direction with respect to the spot light, a photoelectric signal from the mark is obtained as a mark waveform, and the mark waveform is input to a signal processing circuit 42. The signal processing circuit 42 performs analog/digital sampling on the level of the photoelectric signal waveform from the TTL alignment system 41, in response to the position measurement pulse signal from the interferometer 27, and stores this in the internal memory. The signal processing circuit 42 obtains the position of a characteristic portion (pattern edge etc.) of the mark (or resist image) from the profile of the stored signal waveform, and outputs this position information to a main control system 50.

Hereunder is a detailed description of the exposure method according to the present embodiment.

Figure 3:
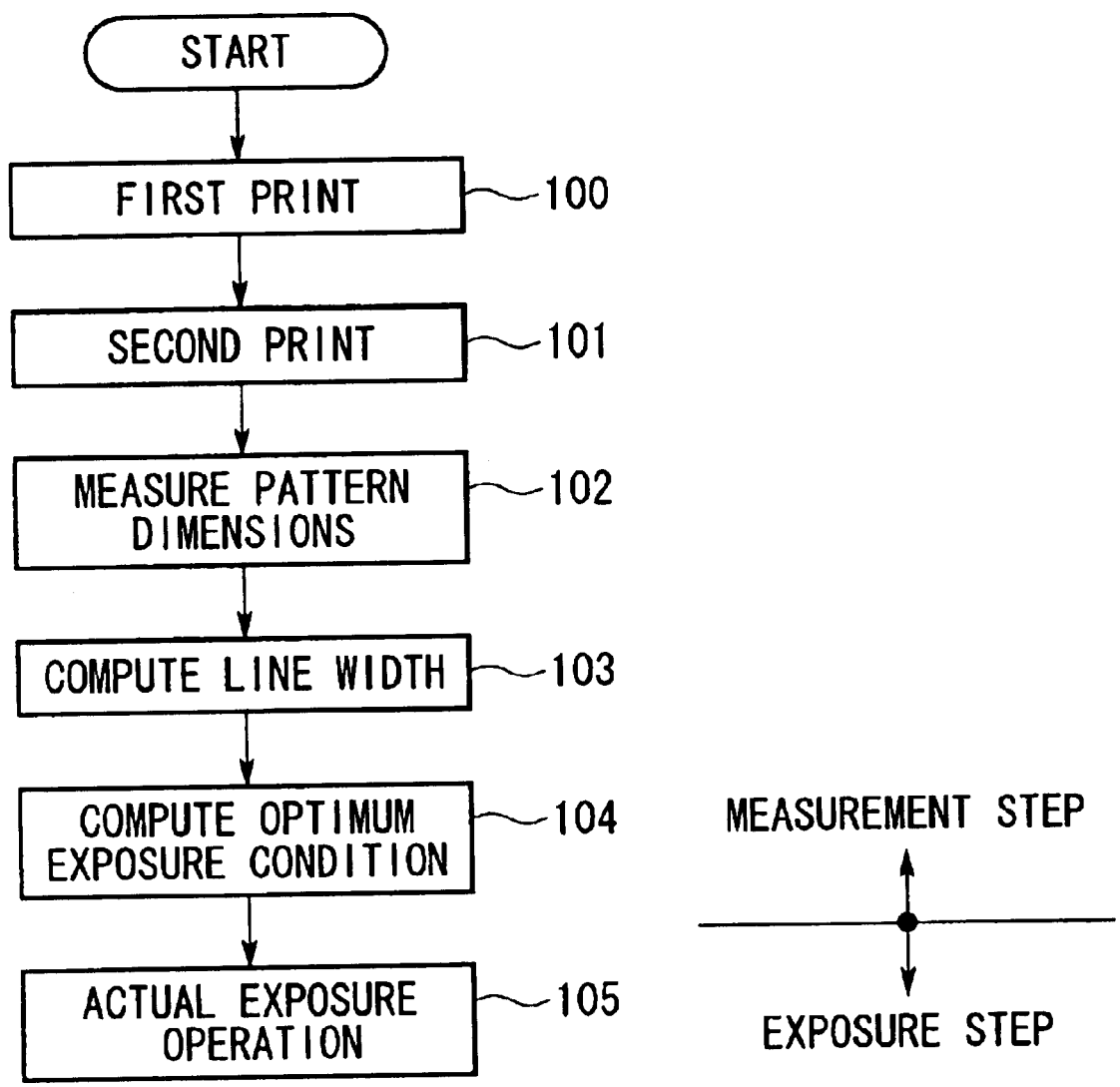
FIG. 3 is a flow chart showing an example of an exposure method according to the present invention.

The flowchart of FIG. 3 shows the steps in an exposure method of this embodiment. This exposure method comprises; a measurement step of measuring the line width of the pattern transferred to the wafer spread with a resist, using an inspection pattern formed on the reticle together with the circuit pattern, and an exposure step of transferring the circuit pattern on the reticle to the wafer. In this embodiment, a scanning type exposure apparatus is shown as the exposure apparatus. However, in the measurement step, the reticle and the wafer may be simultaneously scanned and the inspection pattern group in the mark area transferred to the wafer. Furthermore, the inspection pattern group in the mark area MA may be transferred onto the wafer while maintaining the reticle and the mask stationary.

At first, to start the measurement step, the reticle R shown in FIG. 1A is set on the reticle stage RS of FIG. 2. The reticle R is set so that the mark area MA is positioned on the scanning advance direction (-X-direction) side of the reticle R with respect to the circuit pattern area PA. This position is accurately aligned with a reticle alignment system (not shown in the figure). Furthermore, the movable blade 17 is driven to change the size of the aperture AP of the movable blade 17 to a size which includes the mark areas MA1, MA2, and MA3 but excludes the pattern area PA. Moreover, the reticle stage RS is driven so that the center position of the mark area MA2 coincides with the optical axis of the projection optical system PL.

In the measurement step, at first by means of the exposure apparatus, the pattern images of the mark areas MA1, MA2 and MA3 on the reticle R are transferred to the resist layer on the wafer W (first print: step 100). The exposure amount of the first print is set to be less than the necessary exposure amount for sufficiently exposing the exposure plate, based on the sensitivity of the exposure plate (for example, an exposure amount of ½ of the necessary exposure amount).

Figure 4:
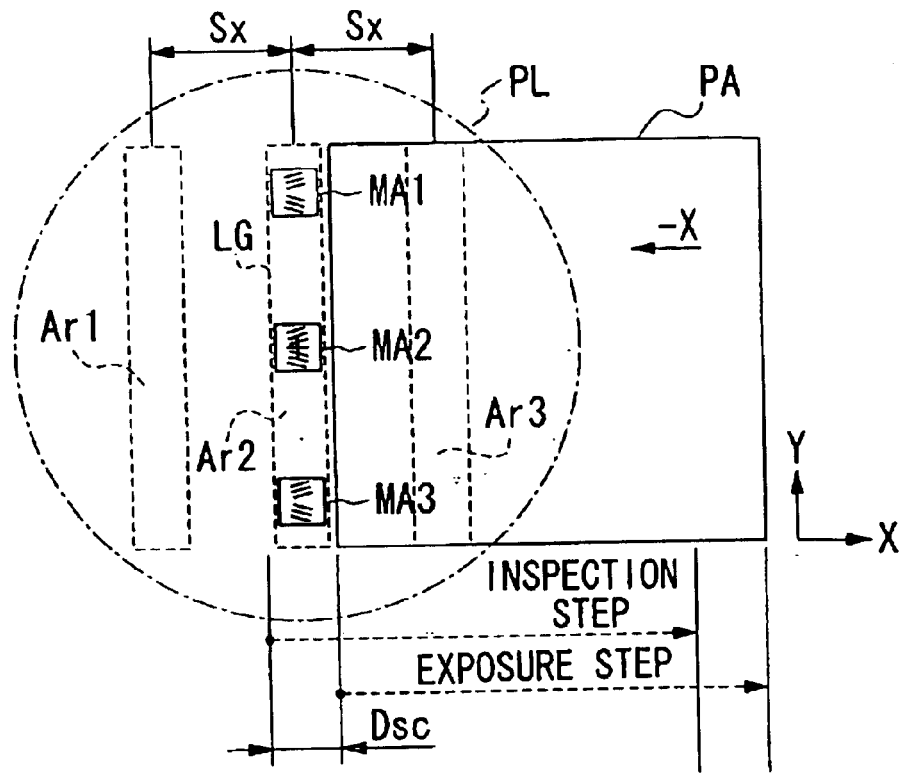
FIG. 4 is a view showing aspects for scanning exposure of the mask of FIG. 1A through FIG. 1C.

Reference symbol LG in FIG. 4 denotes an illumination area of rectangular slit shape to be exposed on the reticle R. In this embodiment, since three mark areas MA1, MA2 and MA3 are set on the reticle R, measurement of the line width can be performed at three locations in the exposure area. Furthermore, if the reticle stage RS is driven so that the mark areas MA1, MA2 and MA3 are moved Sx in the -X-direction and the X-direction, and the patterns of the respective mark areas MA are transferred onto the wafer W (areas Ar1, Ar2 and Ar3), then the measurement of the line width can be performed at a total of nine positions. Moreover, by moving the mark areas MA1, MA2 and MA3 a distance being different from Sx, or by moving the reticle stage RS in the Y-direction (for example by moving so that either one of the mark area MA1 and the mark area MA2 is positioned between the mark area MA1 and the mark area MA2), then the measurement positions in the X-direction and the Y-direction can also be further increased. In the case where line measurement is performed at more than three places within the exposure area, then the aperture of the movable blade 17 is controlled so that the mark areas MA1, MA2 and MA3 can be always illuminated even when the reticle stage RS is driven. In this embodiment, the mark area MA is set at three locations. However, the construction may be such that this is set at only one location (for example, mark area MA2 only). In this case, the aperture of the movable blade 17 may be controlled so that only the mark area MA2 can be illuminated.

Next, using the same reticle R, a second exposure is performed for the projection image of the mark areas MA1, MA2 and MA3 for which the first exposure has been performed (second print: step 101).

In this second exposure, the focus conditions are made the same as those for the first exposure. Furthermore, the exposure amount of the second print is set so that the sum with the exposure amount of the first print becomes the exposure amount necessary for sufficiently exposing the exposure plate (for example, an exposure amount of ½ of the necessary exposure amount). The respective patterns of the mark areas MA1, MA2 and MA3 to be subsequently projected, are accurately displaced by βDy (where β is the reduction magnification of the projection lens; for example ¼ or ⅕) in the Y-direction with respect to the projection images of the mark areas MA1, MA2 and MA3 exposed the first time, and are transferred onto the wafer W. As a result, on the resist layer within one exposure area on the wafer W, for each of the mark areas MA1, MA2 and MA3 at three places, an image is formed with the linear pattern group TP1 and the linear pattern group TP2 overlapped as shown in FIG. 1C.

Then, the exposure apparatus automatically measures the dimensions of the wedge-shaped pattern formed as a latent image on the wafer W, using for example the alignment system 41 of the TTL method (step 102).

In this embodiment, there are parts where the wedge-shaped patterns IR1, IR2 and IR3 are not completely exposed with the double exposure. Furthermore, in the automatic measurement, two systems, namely the beforementioned alignment system 41 of the TTL method, and a wafer alignment system of an off-axis method (not shown in the figure) can be used. Hereunder a description is given with reference to FIG. 5, of a method of measuring the dimension La in the X-direction of the wedge-shaped pattern IR1 using the alignment system 41 (detection system) of the TTL method.

Figure 5:
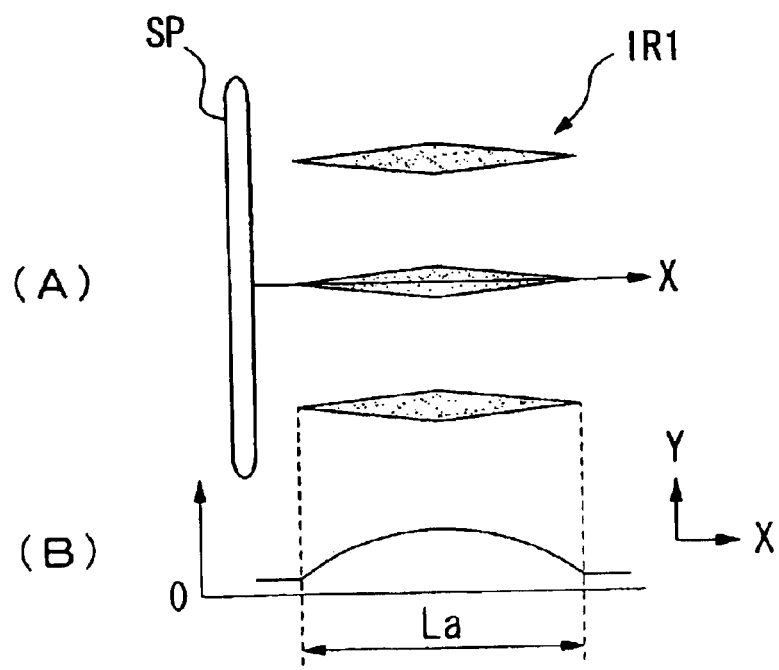
FIG. 5 is a view showing aspects of dimension measurement of a resist image with a TTL alignment system.

Since the wedge-shaped pattern IR1 is formed by doubly exposing the linear pattern groups TP1 and TP2 of the multiple line-and-space form shown in FIG. 1A through FIG. 1C, then with respect to the direction (Y-direction) perpendicular to the longitudinal direction of the wedge (X-direction), this has a periodic construction being similar to a diffraction grating mark. By extending a slit shape spot light SP in the Y-direction, and moving the wafer stage ST in the X-direction, the spot light SP and the wedge-shaped pattern IR1 are relatively scanned to thereby generate diffracted light (±primary, ±secondary light etc.) which can be received by the TTL alignment system 41. FIG. 5(B) shows the photoelectric signal waveform from the photoelectric element which receives this diffracted light. This signal waveform is taken into the signal processing circuit 42, and binary digitized with a suitable slice level to obtain the length in the X-direction, so that the dimension La of the wedge-shaped pattern IR1 can be computed. The pitch in the Y-direction of the wedge-shaped pattern IR1 is constant. However, since in the X-direction, the sequential duty (the proportions of the irregularities) changes, the diffraction efficiency changes during spot scanning in the X-direction, so that the signal level drops at the tips of the wedge. Furthermore, when as shown in FIG. 5, the inspection pattern group is formed so that a plurality of wedge-shaped patterns IR1 are formed in the Y-direction, the signal strength is increased due to the diffracted light, so that the dimensions of the wedge-shaped pattern IR1 can be measured even more reliably. If a photochromic element is used as the photosensitive substrate, then the dimensions of the latent image of the wedge-shaped pattern can be even more easily measured.

Next, the main control system 50 computes the line width of the measurement pattern which has been actually exposed on the resist layer on the wafer W, from the dimension La in the X-direction of the wedge-shaped pattern IR1 (step 103).

Figure 6:
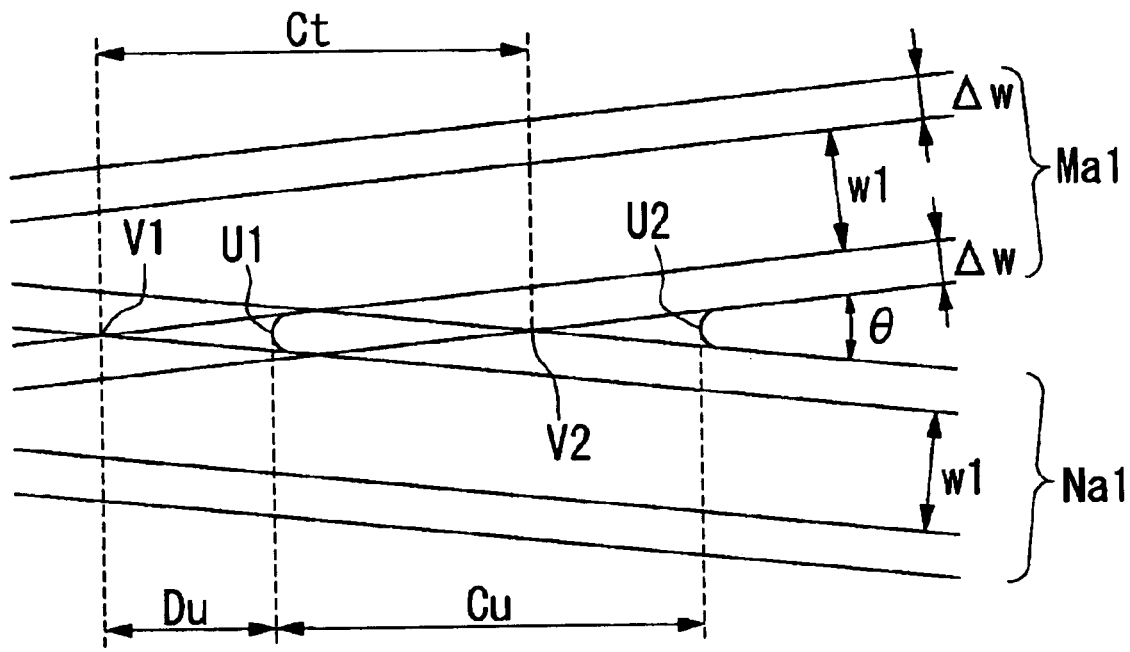
FIG. 6 is a diagram for explaining an aspect of line width measurement.
Figure 7:
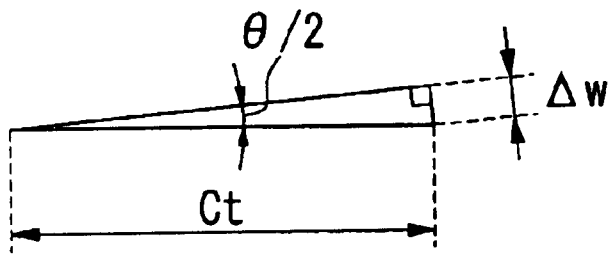
FIG. 7 is a diagram for explaining an aspect of line width measurement.

Hereunder is a description of this line width computation method, with reference to FIG. 6 and FIG. 7. Since the theory for obtaining the line width is disclosed in U.S. Pat. No. 4,908,656, the contents thereof are incorporated in this specification by reference, and a detailed description is omitted. FIG. 6 shows the part where the projection image Ma1 of the measurement pattern Ma, and the projection image Na1 of the measurement pattern Na of linear form of widths w are overlapped on the reticle R, giving an ideal line width of w1 which should be formed on the resist layer. Furthermore, the angle of intersection of the two images Ma1 and Na1 is θ, and a resist image (latent image) with a line width change of 2Δw with respect to the ideal line width w1 is formed.

In the case where the patterns of the ideal line width w1 intersect, the internal edges of the two projection images Ma1 and Na1 intersect at an intersection point V1. On the other hand, in the case where the pattern with the line width changed from w1 to w1+2Δw intersects, the geometrical intersection point moves by a distance Ct from V1 to V2. The relationship between the distance Ct and the intersection angle θ, as shown in FIG. 7 is represented by the following equation (2) with the line width change amount Δw as a variable.

$$Ct = \Delta w / \sin(\theta/2) \quad (2)$$

However, in the case where actually the pattern becomes a latent image, the parts (the wedge-shaped tip portions) of the geometrical intersection points V1 and V2 change. Therefore, the tips U1 and U2 of the wedge-shaped resist images are respectively formed at positions displaced a distance Du from the respective intersection points V1 and V2. At this time, with regards to a pitch Cu of the tips U1 and U2, Cu=Ct is accurately reproduced within a fixed range. In the case of the wedge-shaped pattern IR1 in FIG. 1C, since this has left-right symmetry in the X-direction (rhombic shape), then when a line width change occurs, the wedge tip portions at both sides formed as apex angles, move in opposite directions to each other.

Therefore, if the dimension La in the X-direction of the wedge-shaped pattern IR1 for the case where the resist image (latent image) is formed with the ideal line width w1 is made "a", and the line width change amount is made $\Delta w$, the dimension change amount $\Delta a$ of the pattern IR1 due to this line width change, is expressed by the following equation (3) based on equation (2).

$$\Delta a = 2Cu = 2Ct = -2\Delta w / \sin(\theta/2) \quad (3)$$

The reference symbol for the positive angle shows that in the case where the dimension "a" is shorter than the original value ($\Delta a$ is negative), the relative value of the line width becomes thicker by a line width change amount $2\Delta w$. Moreover, this equation (3) can be transformed to the following equation (4).

$$2\Delta w = -\Delta a \cdot \sin(\theta/2) \quad (4)$$

From this, if the pattern line width of the linear reticle image is w0, and the length dimension La of the wedge-shaped pattern IR1 at this time is a0, and this is stored beforehand as the reference data, then by measuring the dimension a1 of the formed wedge-shaped pattern IR1, and substituting this in the following equation (5), the line width w1 of the resist image of this measurement pattern can be obtained.

$$w1 = w0 + 2\Delta w$$
$$= w0 - (a1 - a0) \cdot \sin(\theta/2) \quad (5)$$

Here obtaining the dimension a0 for the line with w0, corresponds to obtaining the distance Du shown in FIG. 6 between the geometrical intersection point V1 (V2) and the actual wedge tip U1 (U2). This distance D has some variation attributable for example to the exposure amount at the time of double exposure, and to defocus of the projection optical system PL and the wafer W. However, with this example, since the exposure condition (exposure amount, focus condition) for the first exposure and the second exposure are made the same, then this becomes approximately a constant value with respect to the resist layers of the same thickness. In this example, the first (exposure amount A) and the second (exposure amount B) are made the same exposure amount. However the exposure is not limited to this, and the total of the first and second exposure amounts may be an exposure amount (exposure amount A+exposure amount B) set depending on the aforementioned sensitivity.

In this manner, by automatically measuring the dimension of the wedge-shaped pattern IR1 (or IR2, IR3) using the alignment system provided in the exposure apparatus, the line width of the measurement pattern exposed in the resist layer on the actual wafer W can be computed. In particular, in the length dimension La of the wedge-shaped pattern IR1 of rhombic shape whereby the two measurement patterns (dark portion or light portion) intersecting at an angle $\theta$ can be completely overlapped, the misregistration influence at the time of superposition and exposure is removed, so that the main cause of the change in the length dimension La is only the line width change.

Next, the main control system 50 obtains the optimum exposure condition from the abovmentioned measurement results (step 104).

That is to say, the main control system 50 compares the measurement data for the length dimension La of the wedge-shaped pattern IR1 of rhombic shape which is produced when the two measurement patterns are intersected at angle $\theta$, with the measurement value for the length dimension La of the wedge-shaped pattern IR1 formed in the resist layer on the wafer W, and based on the comparison result, computes the optimum exposure condition (exposure amount and focus position). As a method of computing the optimum exposure amount, a method is adopted where the optimum exposure amount with respect to the length dimension La (or the line width w1 of the measurement pattern) of the wedge-shaped pattern IR1 is obtained beforehand by experiment, and this data and the actual length dimension La (or line width w1) are compared. Moreover, as another method, overlapping of the linear patterns is executed while changing the exposure amount, and the optimum exposure amount is obtained from the length dimension La (or the width w1) of the wedge-shaped pattern formed for each exposure amount. On the other hand, as a method of computing the optimum focus position, the exposure amount is made constant (for example, the optimum exposure amount obtained by the aforementioned method), and overlapping of the linear pattern is executed while changing in predetermined incremental amounts the focus position for each of the respective shot areas set on the wafer W. Then, the optimum focus position can be obtained from the length dimension La (or the line width w1) of the wedge-shaped pattern formed for each of the respective focus positions. Since the measurement steps are able to be automatically executed, the exposure amount can be set up unmanned (auto-setup).

When starting the next exposure step, the main control system 50 changes the setting of the scanning range of the reticle stage RS, or the setting of the field stop mechanism etc. to that for the exposure step. As for the reticle R, the same one as for the measurement step continues to be used, and is accurately aligned at the scanning start position by the reticle alignment system 25. As a result, after completing the auto-setup, the operation proceeds rapidly from the measurement step to the exposure step.

In the exposure step, the wafer W for actual device manufacture is mounted on the wafer stage ST. The exposure apparatus starts the actual exposure operation (step-and-scan exposure) to transfer the projection image of the circuit pattern area PA on the reticle R to the resist layer on the wafer W (step 105).

At the time of the actual exposure operation, with this embodiment, the movable blade 17 of the field stop mechanism 15 is controlled so that only the circuit pattern area PA on the reticle R shown in FIG. 1A is illuminated. Hereunder is a description of this movement.

Figure 8A:
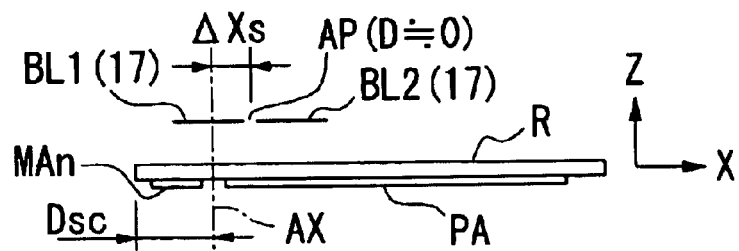
FIG. 8A through FIG. 8E are diagrams for explaining operation of a blade at the time of actual exposure.
Figure 8B:
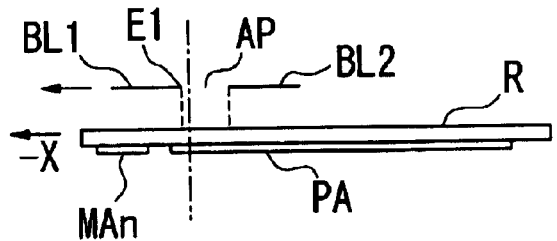
Figure 8C:
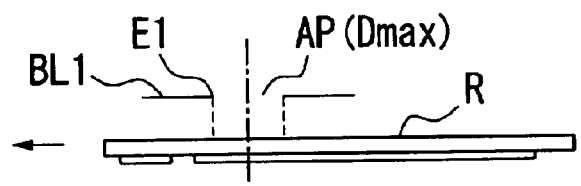
Figure 8D:
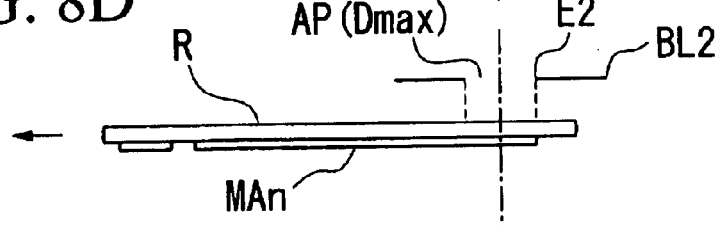
Figure 8E:
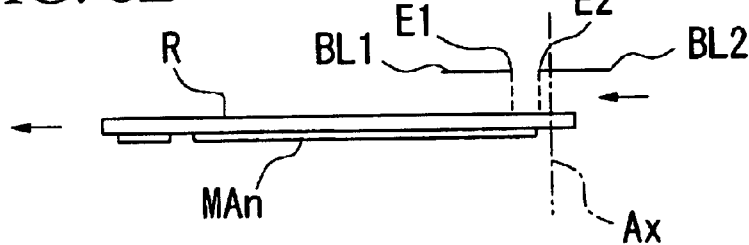

FIG. 8A though FIG. 8E show the operation of the movable blade 17 at the time of the actual exposure operation. In order to simplify explanation, here the movable blade 17 is shown in the figure directly above the reticle R.

At first, the main control system 50 of FIG. 2 sets the reticle R at the X-direction scanning start point by way of the reticle stage drive system 21, and sets one shot area on the wafer W at the scanning start position by way of the wafer stage control circuit 28. Furthermore, the main control system 50 drives the movable blade 17 by way of the drive system 16, and displaces the X-direction center of the aperture AP in the opposite direction (right direction in FIG.

8A) to the scanning advance direction of the reticle R by ΔXs with respect to the optical axis AX. This distance ΔXs is set to approximately half of the maximum width Dmax of the aperture AP. Furthermore, the width D of the aperture AP is set to approximately zero. With regards to the scanning start point of the reticle R, in the exposure step, the optical axis AX is set so as to be positioned between the mark area MA and the circuit pattern area PA, while in the measurement step, the X-coordinate is set offset by Dsc from the scanning start point of the exposure step, so that the optical axis AX is positioned on the scanning advance direction (−X-direction) side of the mark area MA.

Next, the main control system 50 moves the reticle stage RS and the wafer stage ST in opposite directions to each other at a speed ratio proportional to the projection magnification. At this time, as shown in FIG. 8B, the blade BL1 is moved in synchronization with the reticle R, so that the image of the edge E1 of the blade BL1 of the movable blades 17, in the scanning advance direction of the reticle R, is always positioned between the mark area MA and the circuit pattern area PA. Then, scanning of the reticle is progressed, and when as shown in FIG. 8C, the edge E1 of the blade BL1 reaches a position which prescribes the maximum width Dmax of the aperture AP, the blade BL1 is stopped. After this, the reticle R is illuminated and scanned by illumination light which passes through the aperture AP of maximum width Dmax. In the drive system 16 of the field stop mechanism 15 shown in FIG. 2, there is provided an encoder, a tacho generator and the like for monitoring the movement amount and movement speed of the respective blades, and based on the position information and speed information from these, the movement of the movable blade 17 is synchronized to the scanning operation of the reticle stage RS.

The scanning of the reticle R is then further progressed, and when as shown in FIG. 8D, the image of the edge E2 of the blade BL2 of the movable blades 17, in the opposite direction to the scanning advance direction of the reticle R, goes outside the circuit pattern area PA of the reticle R, the main control system 50, as shown in FIG. 8E moves the blade BL2 in synchronization with the reticle R. Then, when the edge E1 of the BL1 goes outside the circuit pattern area PA, the main control system 50 stops the reticle stage RS and the field stop mechanism 15.

Accordingly, only the circuit pattern CP is transferred to inside the shot area of the wafer W. Then, the aforementioned scan exposure is executed repeatedly with respect to the respective shot areas. When the circuit pattern CP has been transferred to all of the shot areas of one wafer W, the exposure apparatus sends the wafer W to the development section where the next step is performed, and then receives a new wafer W for the actual device manufacture, and starts the next scanning exposure for this wafer W. Thereafter, the exposure apparatus repetitively executes a series of actual exposure operations in the exposure step.

As described above, with the reticle (mask) of this embodiment, the reticle used for inspecting the optical characteristics is used as is in the exposure step of manufacturing the actual device. Therefore operations can shift promptly in a short time from the measurement step to the exposure step.

Furthermore, with the reticle of this embodiment, if the line thickness of the inspection pattern KP (measurement pattern) and the line thickness of the circuit pattern CP are made to be correspondingly the same, the line thickness of the circuit pattern (actual circuit pattern) CP actually formed on the wafer W at the time of the actual exposure operation can be easily measured in the measurement step. Furthermore, with this example, at the time of transfer of the circuit pattern CP to the wafer W in the exposure step, the exposure conditions are adjusted based on the line width of the pattern measured in the measurement step. Therefore, exposure accuracy can be reliably improved. Moreover, since the same reticle is used in the measurement step and the exposure step, errors in the optical characteristics attributable to solid body differences of the reticle, do not arise between the steps.

Figure 9:
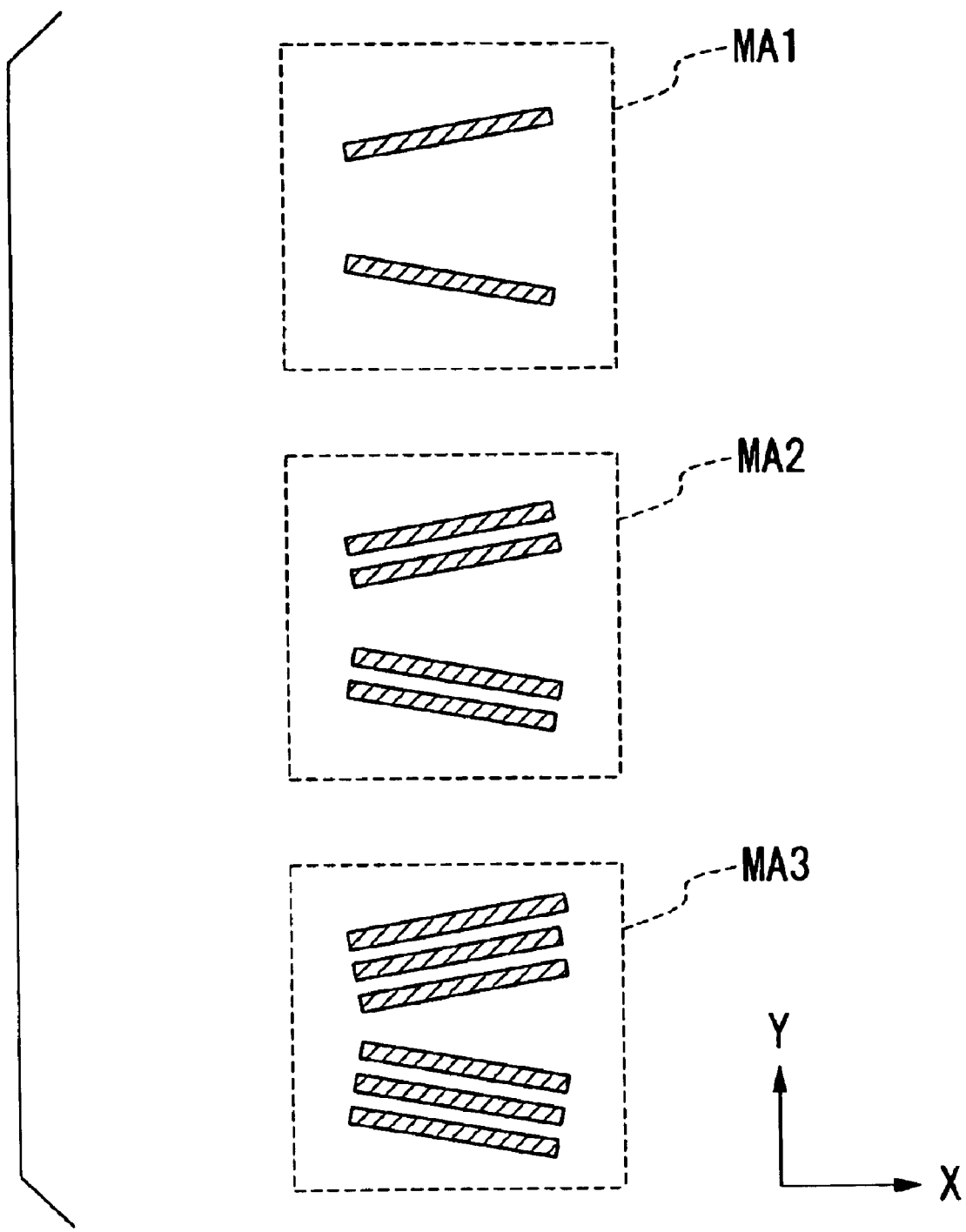
FIG. 9 is a plan view showing patterns where the number of lines are different for each mark area.

Furthermore, as mentioned before, the number of lines and the line width of the pattern of the linear pattern groups TP1 and TP2 of the respective mark areas MA1, MA2 and MA3 as shown in FIG. 1A through FIG. 1C are optional. Therefore, if as shown in FIG. 9, the number of patterns for each mark area MA are changed to form linear pattern groups (line-and-space pattern), it is possible to find out differences in the diffraction phenomena due to the form of the line-and-space pattern, from the change of the line width for each mark area MA. Hence optimum exposure conditions corresponding to the type of circuit pattern CP (line-and-space pattern) can be determined.

Figure 10A:
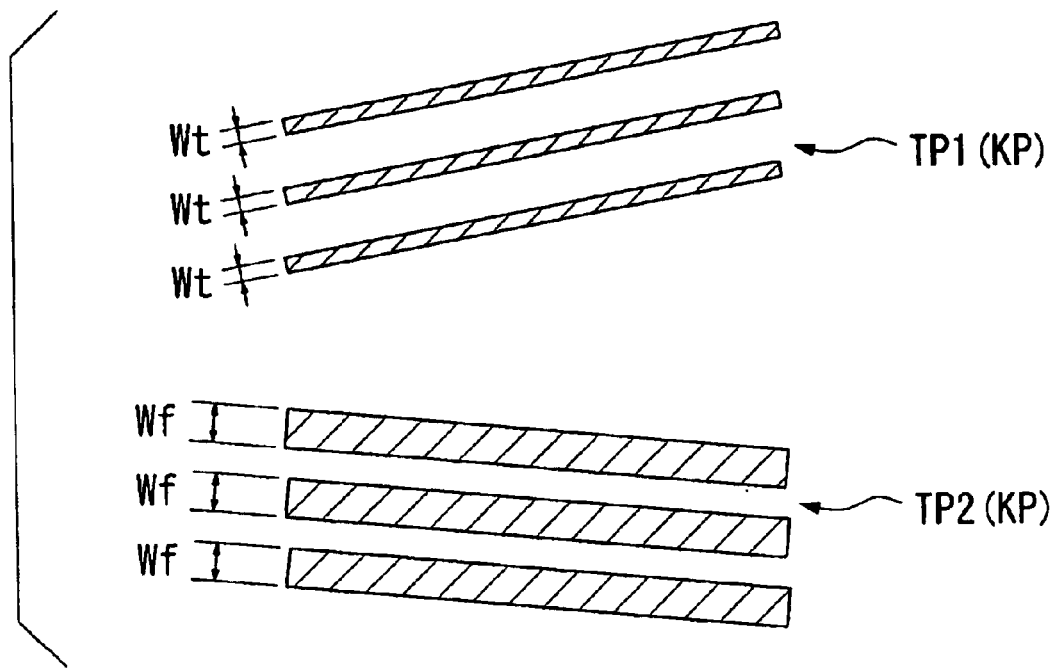
FIG. 10A and FIG. 10B are plan views showing patterns for where line widths are different from each other.
Figure 10B:
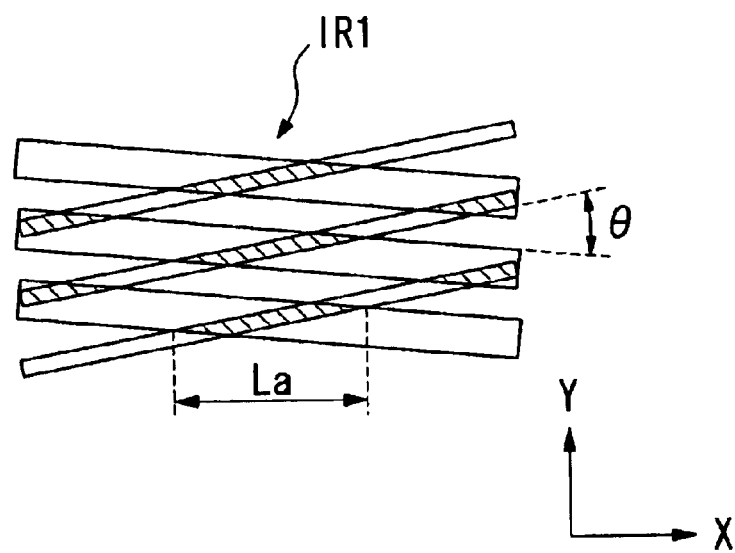

Moreover, as shown in FIG. 10A and FIG. 10B, if the two linear pattern groups TP1 and TP2 (inspection pattern KP) which are overlapped, are formed with mutually different line widths, an advantage arises in that also with line widths of fine patterns, even more accurate measurement is possible. That is to say, by forming a second linear pattern group TP2 with a thicker line width Wf than a line width Wt of a first linear pattern group TP1 corresponding to the line width of the actual circuit pattern (for example the minimum line width of the actual circuit pattern), then compared to the case where the second linear pattern group TP2 is formed with the same line width Wt, as shown in FIG. 10B, the length La of the wedge-shaped pattern IR1 at the time of overlapping can be lengthened. According to the aforementioned line width computation method, if just the dimension La in the X-direction of the wedge-shaped pattern IR1 when the resist image (latent image) is formed at an ideal line width, is obtained beforehand, then also in the case where different line widths are overlapped, it is possible to compute the respective line widths. Accordingly, by making the line width of one pattern thick, the line width of the other pattern can be shown enlarged. Hence, if for example the first linear pattern is formed at a line width commensurable with the minimum line width of the actual circuit pattern, then even a minimum line width of a fine actual circuit pattern can be reliably measured.

Figure 11A:
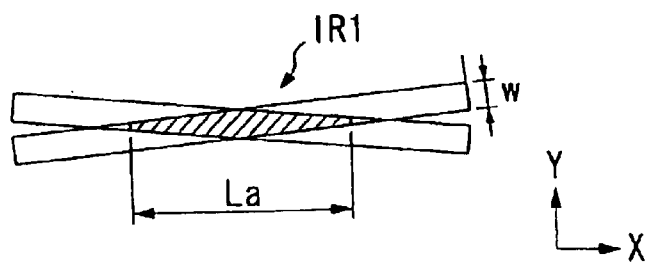
FIG. 11A and FIG. 11B are diagrams for explaining asymmetric aberration of a projection optical system.
Figure 11B:
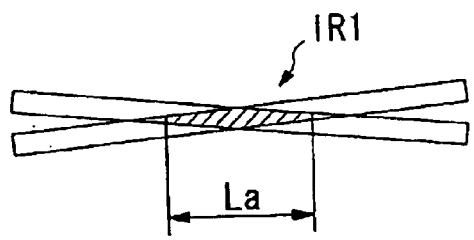

Furthermore, FIG. 11A and FIG. 11B schematically show the wedge-shaped patterns IR1 formed in different mark areas MA (for example FIG. 11A shows mark area MA, and FIG. 11B shows mark area MA2). These are formed by exposing at the same exposure amount and at the best focus. In the reticle R of this example, the mark area MA is formed spaced apart at a predetermined pitch in the Y-direction only. Therefore when asymmetric aberration in the Y-direction exists in the projection optical system PL, even if exposure conditions are the same (exposure amount and focus position), the line width in the Y-direction of the measurement pattern which is actually formed changes, so that in FIG. 11A and FIG. 11B, the line widths w of the measurement patterns are mutually different. Therefore, if the difference of the line widths w of the respective mark areas MA under optimum exposure conditions are obtained, it is possible to obtain the asymmetric aberration in the Y-direction. The difference of these line widths w is indicated by an enlargement in the difference of the dimensions La of the wedge-shaped patterns IR1.

Figure 12:
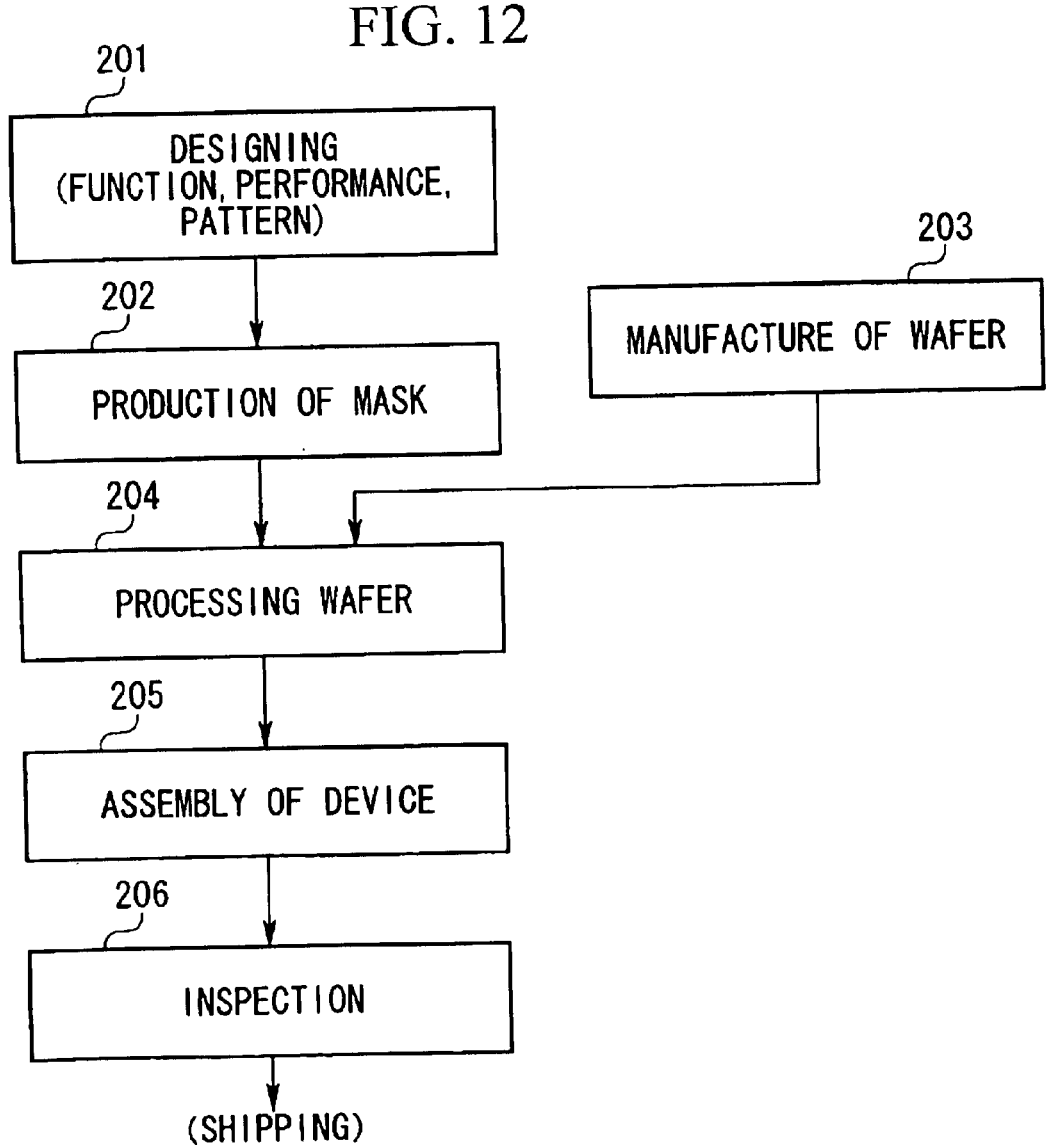
FIG. 12 is a flow chart showing steps in the manufacture of a semiconductor device.

Moreover, the flow chart of FIG. 12 shows an example of the manufacturing steps for a semiconductor device. The semiconductor device is manufactured by undergoing steps such as; a step 201 for designing the function and performance of the device, a step 202 for fabricating a mask (reticle) based on this design step, a step 203 for manufacturing a wafer from a silicon material, a wafer processing step 204 for exposing a pattern of a mask onto a wafer by the abovementioned embodiment, a device assembly step 205 (including a dicing step, a bonding step and a packaging step), and an inspection step 206.

In the manufacturing step of this semiconductor device, generally a considerable amount of time is required for exchanging the reticle, such as for examining for foreign matter on the front and rear surfaces of the reticle. However by using the same reticle for the measurement step and the exposure step as with this embodiment, the number of exchanges of the reticle can be reduced. Moreover, the exposure step shown in this embodiment, is repeated at least once and actually many times in the manufacturing step of the semiconductor device. Accordingly, the time for shifting from the measurement step to the exposure step as mentioned above is shortened, and the number of exchanges of the reticle is reduced. Therefore the overall operation efficiency of the manufacturing step of the semiconductor device can be increased.

Furthermore, in this embodiment there is the advantage that, since an exposure apparatus of the step-and-scan method is used, then even if the inspection pattern KP is formed in an area (mark area MA) different from the circuit pattern area PA, the inspection pattern KP can be easily illuminated by merely offsetting the scan operation. However, the reticle of this embodiment is also applicable to an exposure apparatus of the so-called step-and repeat method where the pattern of the reticle is exposed with the reticle and the wafer in a stationary condition, and the wafer is sequentially stepped. That is to say, as shown in FIG. 13A and FIG. 13B, by configuring the reticle stage RS so that the mask area MA can be moved to an optional position, then also with an exposure apparatus of the step-and-repeat method, the inspection pattern KP can be easily illuminated.

Next is a description of a second embodiment of a mask according to the present invention.

Figure 14A:
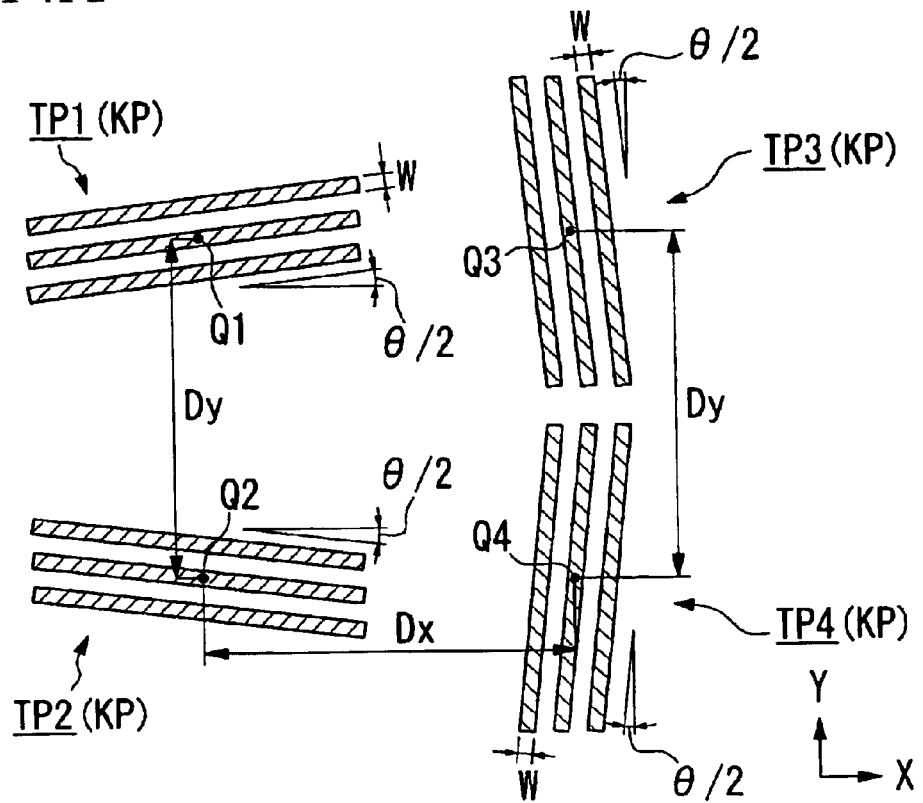
FIG. 14A and FIG. 14B are plan views showing pattern arrays of a second embodiment of a mask according to the present invention.

The mask (reticle) of the second embodiment has, as the inspection pattern KP formed inside the mark area MA, in addition to the linear pattern groups TP1 and TP2 extending in the X-direction as shown in the first embodiment, linear pattern groups TP3 and TP4 extending in the approximate Y-direction as shown in FIG. 14A. The width and length of the linear pattern groups TP3 and TP4 are exactly the same as for the linear pattern groups TP1 and TP2 explained in the first embodiment, and the centers Q3 and Q4 are shifted by Dx in the X-direction. Furthermore these are formed in a condition with the linear opaque patterns (measurement patterns) respectively rotated through 90° about the respective center points Q3 and Q4. The linear pattern groups TP3 and TP4 need not necessarily be abeam of the linear pattern groups TP1 and TP2 (that is to say, the condition where the Y-coordinate values of the center point Q1 of the linear pattern group TP1 and the center point Q3 of the linear pattern group TP3 coincide). However the Y-coordinate values of the mutual center points Q3 and Q4 have a difference Dy, the same as for the linear pattern groups TP1 and TP2.

Figure 14B:
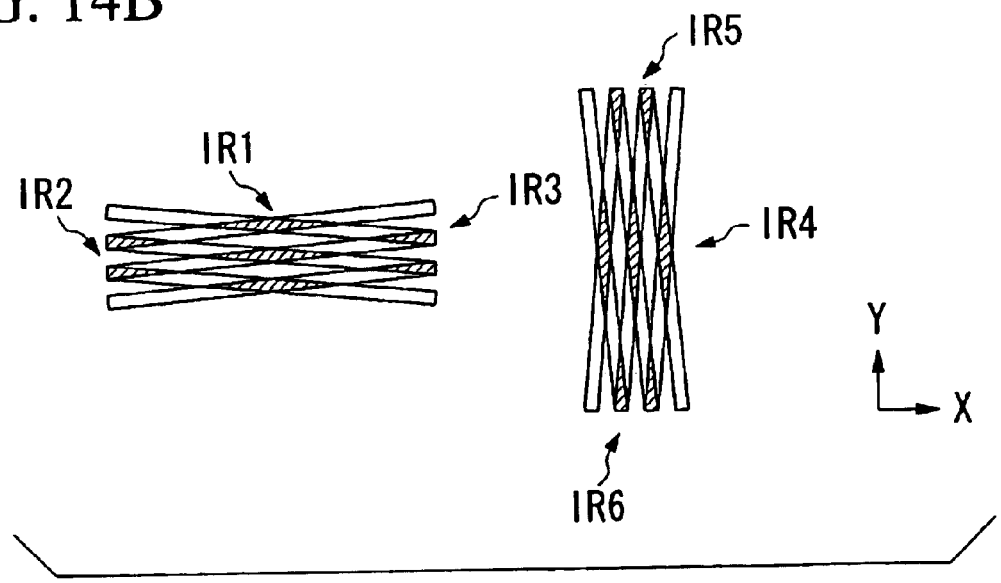

In this second embodiment, as with the first embodiment, the projection image of the pattern to be projected next is accurately displaced with respect to the latent image exposed at the first time, by βDy in the Y-direction, and transferred to the wafer W. Accordingly, as shown in FIG. 14B, the linear pattern groups TP1 and TP3 and the linear pattern groups TP2 and TP4 are overlapped and exposed, and the wedge-shaped patterns IR1, IR2 and IR3 extending in the X-direction, and the wedge-shaped patterns IR4, IR5 and IR6 extending the in Y-direction are formed on the wafer as the latent images. Consequently, for example in the beforementioned exposure apparatus of the step-and-repeat type of FIG. 13A and FIG. 13B, each double exposure is performed at the position where the position of the mark area MA is displaced in the X-direction, and by measuring the dimensions of the wedge-shaped patterns IR1 through IR6 formed as the latent images at each position, then in addition to the Y-direction asymmetric aberration explained in the first embodiment, it is possible to measure the X-direction asymmetric aberration. As a method for obtaining the same effect as with the reticle of this embodiment, after forming the wedge-shaped patterns extending in the X-direction by the reticle R shown in the first embodiment, the wedge-shaped pattern extending in the Y-direction can be formed by turning the reticle R through 90°, and in this condition, doubly exposing the linear pattern groups TP1 and TP2.

Figure 15A:
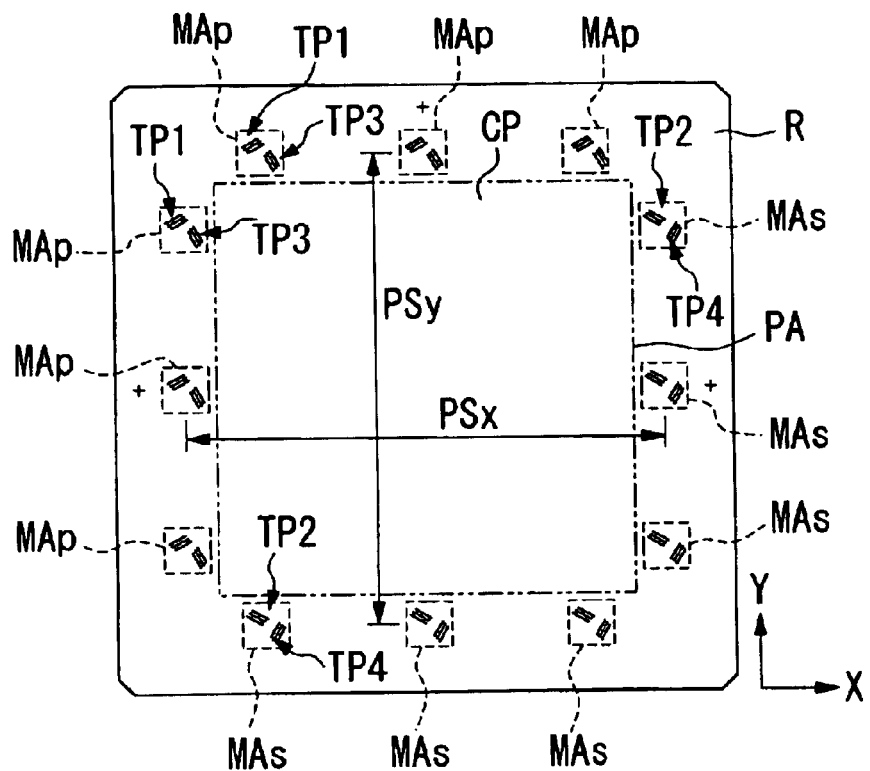
FIG. 15A and FIG. 15B are plan views showing a third embodiment of a mask according the present invention.
Figure 15B:
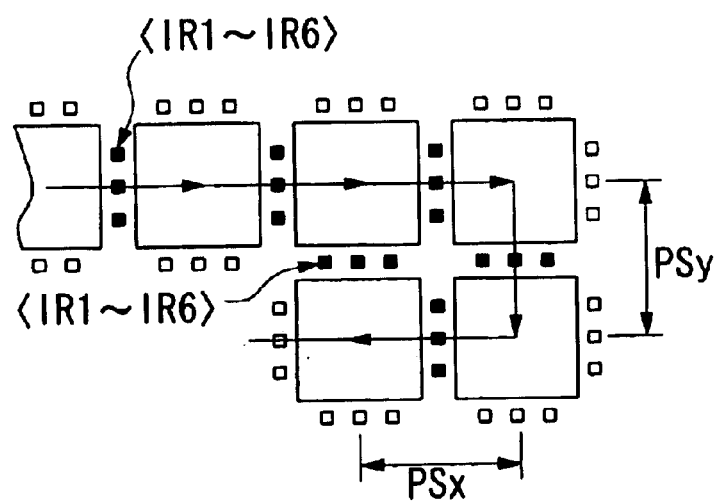

FIG. 15A and FIG. 15B show a third embodiment of a mask according to the present invention.

In this mask (reticle) R, mark areas MAp arranged with the linear pattern groups TP1 and TP3 of FIG. 14A and FIG. 14B intersecting at 90° to each other, and mark areas MAs arranged with the linear pattern groups TP2 and TP4 intersecting at 90° to each other, are formed in a condition with the circuit pattern area PA therebetween, and separated in the X-direction by PSx and in the Y-direction by PSy.

In this third embodiment, in the measurement step, as shown in FIG. 15B, after the first exposure (first print), the wafer stage ST is stepped PSx in the X-direction or PSy in the Y-direction, and the second exposure performed. As a result, projection images of the mark areas Map are overlapped on the virtual images of the mark areas MAs, and as shown in FIG. 15B, doubly exposed wedge-shaped patterns IR1 through IR6 are formed. Then, by measuring the dimensions of these wedge-shaped patterns IR1 through IR6, it is possible to measure the stepping accuracy in the two dimensional direction of the wafer stage ST. Hereunder is a description of the theory for measuring the stepping accuracy, with reference to FIG. 16A through FIG. 16C.

Figure 16A:
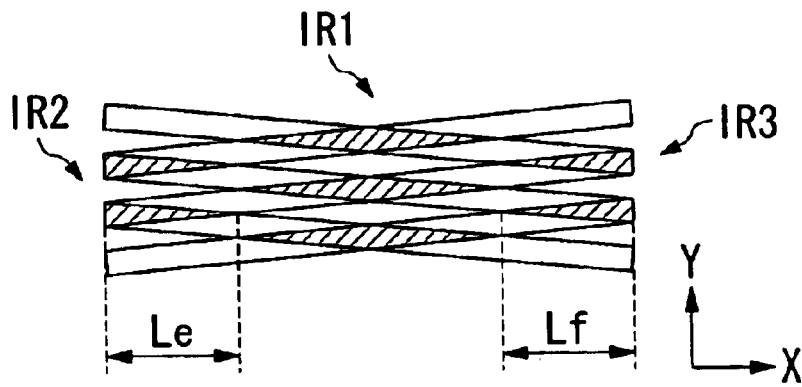
FIG. 16A through FIG. 16C are diagrams for explaining a method of measuring stepping error by double exposure.
Figure 16B:
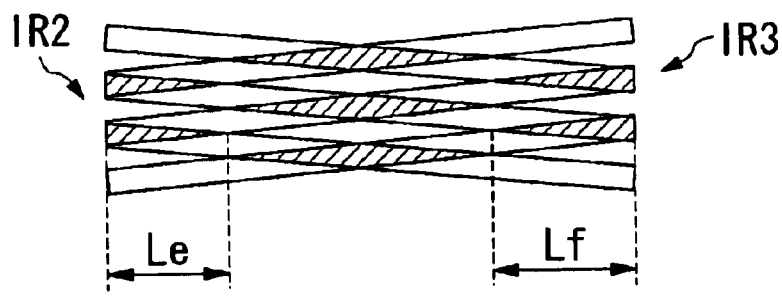
Figure 16C:
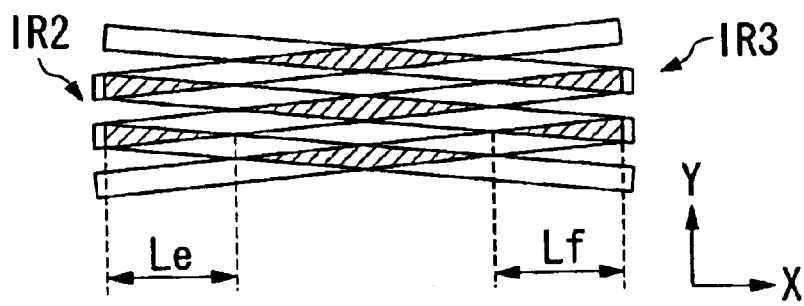

FIG. 16A through FIG. 16C show the wedge-shaped patterns IR1, IR2 and IR3 of the wedge-shaped patterns formed by overlapping and exposing the abovementioned mark areas MAp and the mark areas MAs.

FIG. 16A shows the condition where the two linear pattern groups TP1 and TP2 are accurately overlapped in the X and Y-directions (displacement amount $\Delta x=\Delta y=0$) respectively. In this case, the dimensions Le and Lf in the X-direction of the left and right wedge-shaped patterns IR2 and IR3 are the same. However, as shown in FIG. 16B, in the case where the two linear pattern groups TP1 and TP2 at the time of double exposure are overlapped relatively with a discrepancy $\Delta y$ in the Y-direction, the dimension Le of the wedge-shaped pattern IR2 becomes shorter by $\Delta Lx/2$ compared to the case where the positional displacement amount of FIG. 16A is zero, and the dimension Lf of the wedge-shaped pattern IR3 becomes longer by $\Delta Lx/2$. There is also the case where due to the direction of the discrepancy $\Delta y$, the long and short relationship becomes opposite. Furthermore, in the case where at the time of double exposure, the two linear pattern groups TP1 and TP2 are caused to be relatively misaligned in the X-direction only, as shown in FIG. 16C, the left and right wedge-shaped patterns IR2 and IR3 dimensionally change by the same amount. Hence the difference between the dimension Le and the dimension Lf becomes zero. Therefore, the discrepancy ΔY component in the Y-direction at the time of overlapping, can be computed by the following equation (6), from the wedge-shaped patterns IR2 and IR3 formed by doubly exposing the two linear pattern groups TP1 and TP2 extending in the approximate X-direction.

$$\Delta Y = (Lf - Le) \cdot \tan(\theta/2).$$

$$= \Delta Lx \cdot \tan(\theta/2) \quad (6)$$

Here, even if the line width changes due to the exposure conditions, since the change amount of the dimensions Le and Lf are mutually the same, the dimension difference ΔLx does not change, and this dimension difference ΔLx is proportional to only the displacement amount of the overlap at the time of double exposure. Similarly, the discrepancy ΔX component in the X-direction at the time of overlapping, can be computed from the wedge-shaped patterns IR5 and IR6 formed by doubly exposing the linear pattern groups TP3 and TP4. Then, from these it is possible to measure the stepping accuracy in the two dimensional direction of the wafer stage ST. Furthermore, at this time, the wedge-shaped patterns IR1 through IR6 are formed in three sets for each single step. Therefore by comparing the stepping accuracy measured from the images of these three sets with each other, it is also possible to measure the yawing (the minute rotation within the X-Y plane) at the time of stepping the wafer stage ST.

Next is a description of a fourth embodiment of a mask according to the present invention.

Figure 17A:
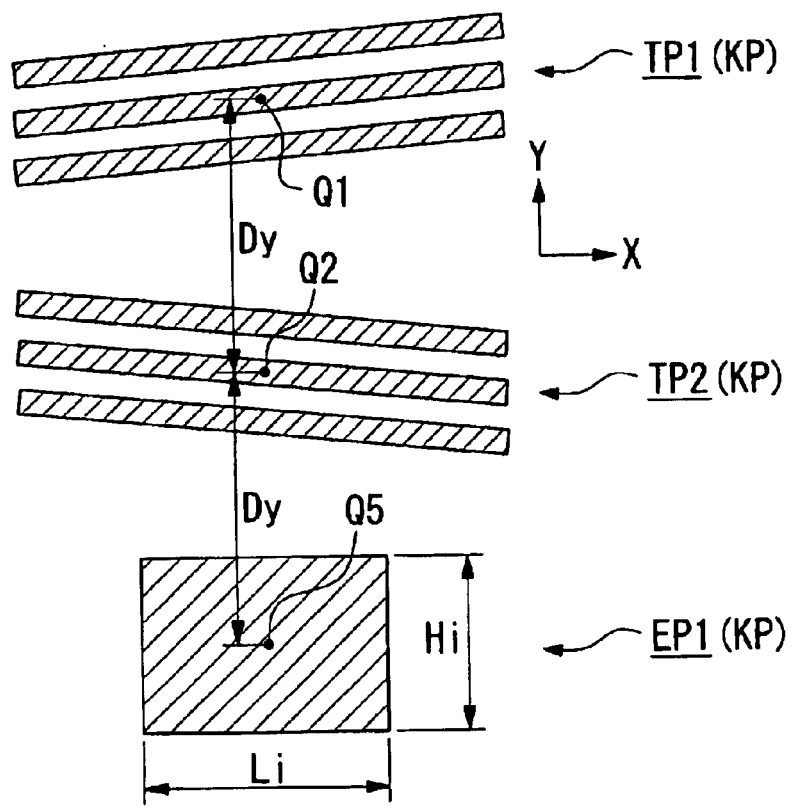
FIG. 17A and FIG. 17B are plan views showing a pattern array of a fourth embodiment of a mask according to the present invention.

The mask (reticle) of the fourth embodiment has, as the inspection pattern KP formed inside the mark area MA, in addition to the linear pattern groups TP1 and TP2 extending in the X-direction as shown in the first embodiment, a rectangular shape extraction pattern EP1 as shown in FIG. 17A. The extraction pattern EP1 is formed as an shading portion on the mask in a rectangular area of width Li and length Hi. The X-coordinate value of the center point Q5 thereof on the mask, coincides with the center points of the linear pattern groups TP1 and TP2, while the Y-coordinate value is shifted by Dy from the center point of the linear pattern group TP2. In the case where the linear pattern groups TP1 and TP2 are formed as light transmitting sections, the extraction pattern EP1 also is similarly formed as a light transmitting section.

Figure 17B:
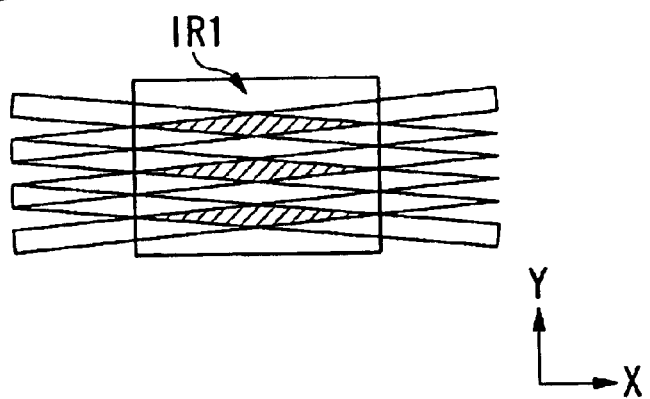

The mask of this fourth embodiment, differs from the embodiments up to here in that three multiple exposures are performed in the measurement step. In the first and second exposures, as described for the aforementioned embodiments, the projection image of the linear pattern group TP2 is overlapped and exposed on the latent image of the linear pattern group TP1. However, the exposure amount at this time is preferably approximately ⅓ of the normal exposure amount. Then, in the third exposure, the projection image of the extraction pattern EP1 is further overlapped and exposed on the latent image for the overlapped linear pattern groups TP1 and TP2. Accordingly, as shown in FIG. 17B, only the wedge-shaped pattern IR1 of rhombic shape is extracted, and formed as the latent image. In this way, in the mask of this embodiment, since this has the extraction pattern EP1, by overlapping and exposing this extraction pattern EP1, it is possible to extract only the desired pattern image, so that the pattern which is observed at the time of measurement can be easily specified. In particular, in the case where the dimensions of the pattern are automatically measured with the exposure apparatus, using an alignment system or the like, the possibility of a malfunction due to a specific miss of the pattern can be reduced.

Furthermore, at the time of this third exposure, the exposure amount may be made approximately ⅓ of the normal exposure amount as with the second exposure. However in the case where as with this embodiment, the inspection pattern KP is formed as an shading portion, by making the exposure amount more than ⅓ of the normal exposure amount, the area where the extraction pattern EP1 is projected and the area outside of this can be more clearly distinguished. Here, the order of overlapping the inspection patterns KP at the three locations as shown in FIG. 17A is not limited to that described above. For example, the linear pattern groups TP2 and TP1 may be overlapped and exposed on the latent image of the extraction pattern EP1. Furthermore, the extraction pattern EP1 may be substituted for by other components of the exposure apparatus outside of the reticle R. For example the movable blade 17 or the like of FIG. 2.

Figure 18A:
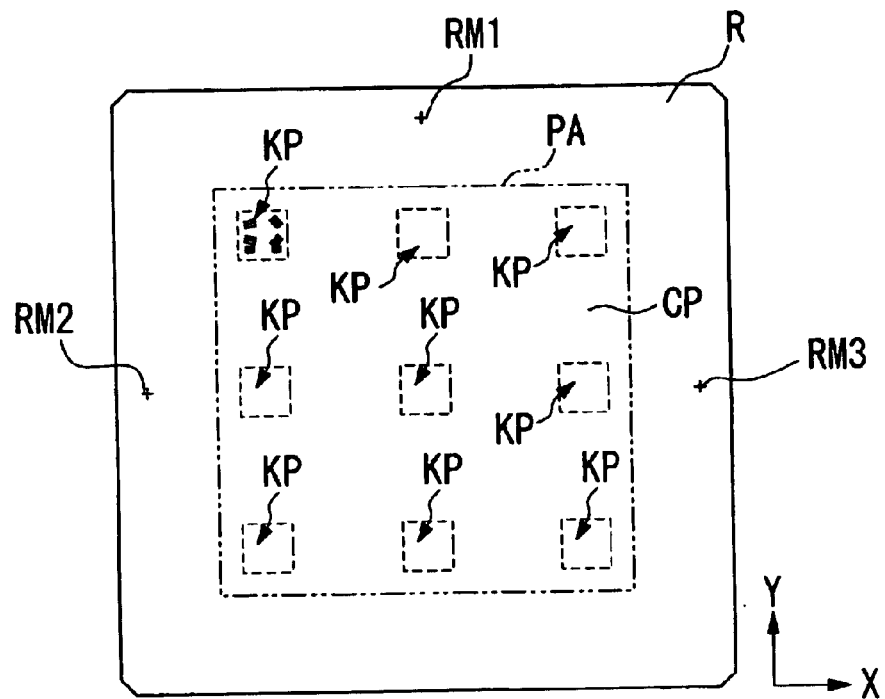
FIG. 18A and FIG. 18B are plan views showing a fifth embodiment of a mask according to the present invention.
Figure 18B:
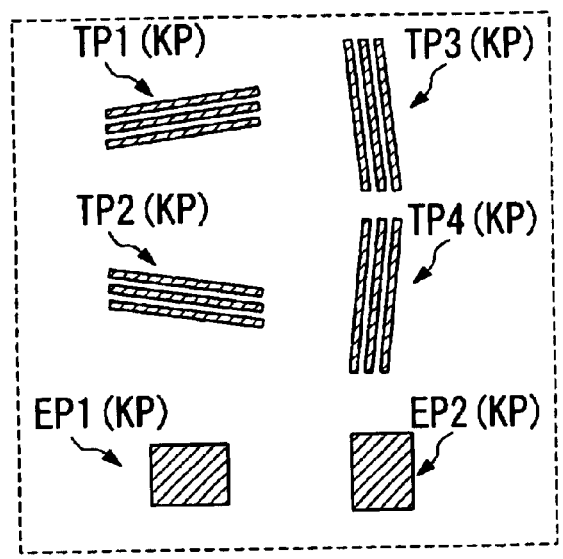

FIG. 18A and FIG. 18B show a fifth embodiment of a mask according to the present invention.

On this mask (reticle R), as the inspection patterns KP, in addition to the linear pattern groups TP1, TP2, TP3 and TP4 shown in FIGS. 14A and 14B, is formed extraction patterns EP1 and EP2 as shown in FIG. 18B. Furthermore, these inspection patterns KP, as shown in FIG. 18A are arranged within the circuit pattern area PA at nine evenly spaced locations, namely the central portion, the four corners, and the central portions of the four sides, and are formed at positions so as not to interfere with the circuit pattern CP.

In the reticle R of this fifth embodiment, in the aforementioned measurement step, the projection images of the extraction patterns EP1 and EP2 are overlapped and exposed on the latent images of the overlapped and exposed linear pattern groups TP1 and TP3, and the linear pattern groups TP2 and TP4. Accordingly, of the wedge-shaped patterns shown in FIG. 14B, only the wedge-shaped patterns IR1 and IR4 are respectively extracted as latent images at nine locations within the circuit pattern area PA. That is to say, if for example in the exposure apparatus of the step-and-repeat type, this reticle R is used, then the resolving power (line width) at the nine locations within the exposure field can be measured without significantly moving the reticle stage RS shown in FIG. 13A and FIG. 13B. Of course, if rather than being limited to nine locations, the inspection pattern KP is arranged even finer, it is possible to check the resolving power at optional locations. Furthermore, by comparing the dimension of the wedge-shaped pattern IR1 extending in the X-direction with the dimension of the wedge-shaped pattern IR4 extending in the Y-direction, it is also possible to measure the distortion of the projection optical system. Moreover, with this reticle R, since it is not necessary to significantly move the reticle stage in the exposure step and the measurement step, then compared to the construction shown in FIG. 13A and FIG. 13B, errors attributable to stage errors are unlikely to occur, enabling an improvement in the adjustment accuracy of the optical characteristics. Here the wedge-shaped pattern IR1 is extracted, however another wedge-shaped pattern (IR2, IR3 etc.) may be extracted.

Incidentally, the inspection patterns KP shown in FIG. 18A and FIG. 18B may be part of the circuit pattern CP. That is to say, by using part of the circuit pattern as the inspection pattern, it is not necessary to ensure a space for the inspection pattern on the reticle R. Hence the circuit pattern area PA can for example be widened compared to the reticle R shown in FIG. 1A through FIG. 1C, and the space on the reticle R can be used without waste. Furthermore, for the inspection pattern KP, the alignment marks RM1, RM2 and RM3 may be used.

Next is a description of a sixth embodiment of a mask according to the present invention.

Figure 19A:
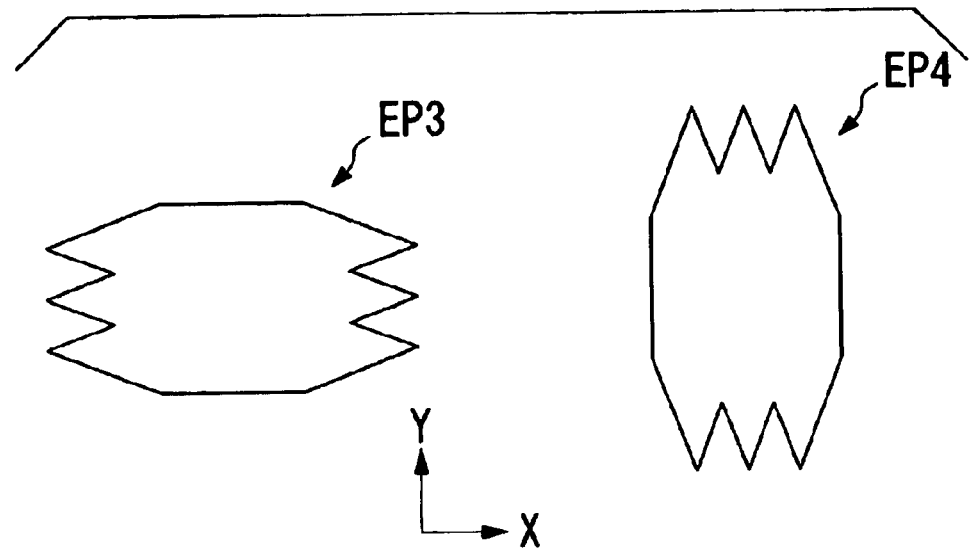
FIG. 19A and FIG. 19B are plan views showing an extraction pattern of a sixth embodiment of a mask according to the present invention.
Figure 19B:
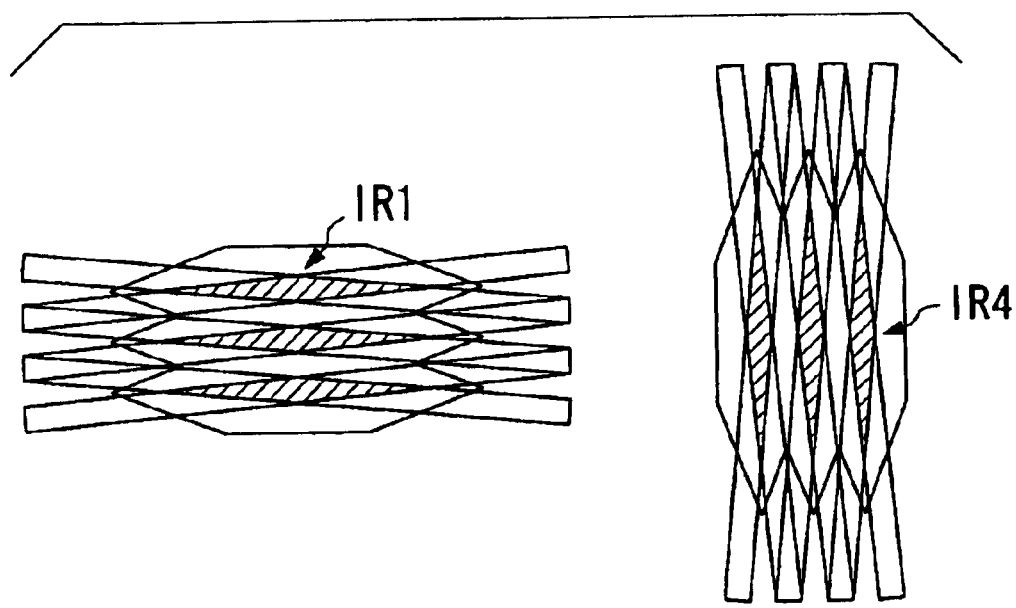

FIG. 19A and FIG. 19B show extraction patterns for the mask of the sixth embodiment. These extraction patterns EP3 and EP4 are formed different from the rectangular extraction patterns in the fifth embodiment, with edge portions formed serrated. That is to say, with the extraction pattern EP3, serrated steps are formed on the two edge portions in the X-direction, while with the extraction pattern EP4, serrated steps are formed on the two edge portions in the Y-direction. Since the extraction patterns EP1 and EP2 in the aforementioned fifth embodiment are formed in rectangular shape, then even though only the wedge-shaped patterns IR1 and IR4 of rhombic shape shown in FIG. 14B are to be extracted, it is easy for the margins of the extraction patterns EP1 and EP2 to become overlapped on the wedge-shaped tip portions of the wedge-shaped patterns IR2, IR3, IR5 and IR6. On the other hand, with the extraction patterns EP3 and EP4 in this embodiment, since the edge portions are formed serrated, by positioning the wedge-shaped tip portions of the wedge-shaped patterns IR2, IR3, IR5 and IR6 in the step grooves, it is difficult for these extraction patterns to overlap the wedge-shaped patterns. Accordingly, even if a misregistration error arises at the time of multiple exposure, it is possible to extract the wedge-shaped patterns IR1 and IR4 more reliably. In particular, in the case where as shown for the fifth embodiment, the inspection pattern KP is formed inside the circuit pattern area PA, by specifying and limiting the extraction area as with this embodiment, then at the time of measuring the pattern dimensions, it is possible to prevent the image of the circuit pattern CP having an influence as noise. Furthermore, by providing only the extraction patterns EP3 and EP4 of this shape outside the circuit pattern area PA, and providing this as other components such as the aforementioned movable blade 17, it is possible to easily realize the situation where a part of the circuit pattern CP is used as the inspection pattern.

The various forms and combinations of the respective constructional elements shown in the abovementioned embodiments and examples, and procedures etc. are but one example, and various modifications of the present invention are possible based on design requirements etc. within a scope which does not depart from the gist of the present invention. The present invention also includes for example the following modifications.

(1) The number and arrangement position of the mark areas formed on the mask (reticle), and the shape of the inspection patterns may be optionally determined. For example, in the first embodiment three mark areas MA are formed as shown in FIG. 1A through FIG. 1C, with the advantage that asymmetric aberration of the projection optical system PL can be easily obtained by comparing the line widths for the optimum exposure conditions, between the three mark areas MA. However, in the case where for example it is sufficient to only measure the line width of the pattern image in the measurement step, then the mark area MA may be singly formed at least on the reticle R.

(2) In the abovementioned embodiments, for example the linear pattern group TP1 rising to the right with respect to the X-axis, and the linear pattern group TP2 rising to the left form a pair of pattern groups overlapping each other. However it is not necessary to have such a pair. For example, by performing double exposure by turning the reticle stage through θ at the time of the second exposure and overlapping the latent image for at the time of the first exposure, then for example it is possible to form a pattern similar to the aforementioned wedge-shaped pattern with only one pattern group, such as the linear pattern group TP1.

(3) Optionally the inspection pattern may be formed in an area different to that of the circuit pattern area, or a part of the circuit pattern may be used as the inspection pattern. However, by using a part of the circuit pattern as the inspection pattern, the space on the mask (reticle) may be used without waste. Moreover, the requirement for again forming on the mask, a pattern (inspection pattern) with a fine line width for example the same as the minimum line width of the actual circuit pattern is obviated, so that performance in mask manufacture is not impaired.

(4) In the aforementioned embodiments, since the dimensions of the wedge-shaped patterns are measured using the alignment system of the exposure apparatus, this has the advantage that the time required for this measurement can be finished in a short time. However other measurement apparatus such as an SEM may be prepared as the means for measuring the pattern dimensions. In this case, the wafer can be pulled out from the processing unit even during the actual exposure operation, and the characteristics of the optical system inspected.

(5) The inspection item conducted by the inspection pattern is not limited to that mentioned above, and the inspection pattern is applicable to various inspection items such as image surface inclination or image surface curvature of an optical system, or positioning (alignment accuracy) used by an alignment system.

(6) In the aforementioned embodiments, the mutually overlapping first linear pattern and the second linear pattern are both formed at an incline with respect to a predetermined axis (for example the X-axis). However since it is sufficient if these intersect each other, then only one of these may be formed inclined with respect to a predetermined axis.

(7) The exposure apparatus shown by the aforementioned embodiments is manufactured by assembling various sub-systems related to the exposure methods given in the claims of this patent application so as to maintain a predetermined mechanical accuracy, electrical accuracy and optical accuracy. In order to ensure these various accuracies, then in the various mechanical systems, adjustment is performed for achieving the mechanical accuracies, and in the various electrical systems adjustment is performed for achieving electrical accuracies. The step of assembling the exposure apparatus from the various sub-systems includes; mechanical connection, wiring connection of the electrical circuits, piping connections of the pneumatic circuits etc. between the various sub-systems. Before the step of assembling the exposure apparatus from the various subsystems, there is a step of individually assembling the various sub-systems. After completing the assembly step of the various sub-systems for the exposure apparatus, overall adjustment is performed to ensure the various accuracies for the whole of the exposure apparatus. Preferably the manufacture of the exposure apparatus is performed in a clean room with temperature and cleanliness etc. controlled.

For the exposure apparatus of the examples, a proximity exposure apparatus where the pattern of the mask is exposed with the mask and the substrate close together without using a projection exposure system, may be used rather than using the scanning type exposure apparatus which moves the mask and the substrate simultaneously and exposes only the pattern of the mask.

Use of the exposure apparatus is not limited to an exposure apparatus for semiconductor manufacture, and for example this may be widely applied to exposure apparatus for liquid crystals for exposing a liquid crystal display element pattern on a rectangular glass plate, or an exposure apparatus for the manufacture of thin film magnetic heads.

Furthermore, the light source for the exposure apparatus of the embodiments is not only a g-line (436 nm), an i-line (365 nm), a KrF excimer laser (248 nm), an ArF excimer laser (193 nm), or an $F_2$ laser (157 nm), but may also use charged particle rays such as X-rays or electron beams. For example, in the case where an electron beam is used, for the electron gun, a lanthanum hexaboride ($LaB_6$) or a tantalum (Ta) thermionic emission type may be used. Furthermore, in the case where an electron beam is used, the construction may use a mask, or may be such that a pattern is formed directly onto a substrate without using the mask.

Moreover, not only a reduction magnification system of a projection optical system is possible, but also an equal magnification or an enlargement system is possible.

Furthermore, in the case where for the projection optical system, a far ultraviolet ray such as an excimer laser is used, then for the glass material, one which passes far ultraviolet rays such as quartz or fluorite may be used, while in the case where an $F_2$ laser or an X-ray is used, an optical system of a cata-dioptric system or a dioptric system (where the reticle also uses a reflection type material) may be used. Moreover, in the case where an electron beam is used, for the optical system, an electron optical system comprising an electron lens and a deflector may be used. Here, the path through which the electron beam passes is in a vacuum.

What is claimed is:

1. A mask comprising:
   a circuit pattern to be transferred to a substrate via an optical system; and
   an inspection pattern to be used for a measurement of a line width of a pattern transferred to said substrate, wherein said inspection pattern includes:
   a first measurement pattern;
   a second measurement pattern to be superimposed on an image of said first measurement pattern; and
   an extraction pattern to be superimposed on an image of said first measurement pattern and an image of said second measurement pattern, and to be used for an extraction of a predetermined image from a superimposed image of said first measurement pattern and said second measurement pattern.

2. A mask according to claim 1, wherein each of said first measurement pattern and said second measurement pattern comprises a plurality of linear patterns which are parallel to each other, and said extraction pattern has a shape which can extract at least one approximate rhombic shape image from an image to be formed by superimposing said first measurement pattern and said second measurement pattern intersecting at a predetermined angle.

3. A mask according to claim 1, wherein said inspection pattern is formed in a separate area to a circuit pattern area in which said circuit pattern is formed.

4. A mask according to claim 1, wherein said inspection pattern is a part of said circuit pattern.

5. A mask according to claim 1, wherein a line width of said inspection pattern corresponds to a line width of said circuit pattern.

6. A mask according to claim 1, wherein said inspection pattern is an isolated pattern.

7. A mask according to claim 1, wherein said inspection pattern is a line-and-space pattern.

8. A mask comprising:
   a base member;
   a first line-and-space pattern formed on said base member with a predetermined line width; and
   a second line-and-space pattern which is to be superimposed on an image of said first line-and-space pattern and which is formed at a predetermined angle with respect to said first line-and-space pattern with a line width different from said predetermined line width.

9. A mask according to claim 8, wherein a circuit pattern is formed in an area different from an area in which said first line-and-space pattern and said second line-and-space pattern are formed.

10. A mask according to claim 8, further comprising an extraction pattern to be used for an extraction of a plurality of diamond-shaped images from a superimposed image of said first line-and-space pattern and said second line-and-space pattern.

11. A mask comprising:
    a base member;
    a first measurement pattern formed on said base member;
    a second measurement pattern formed on said base member and to be superimposed on an image of said first measurement pattern; and
    an extraction pattern formed on said base member and to be superimposed on an image of said first measurement pattern and an image of said second measurement pattern, and to be used for extraction of a predetermined image from a superimposed image of said first measurement pattern and said second measurement pattern.

12. A mask according to claim 11, wherein a line width of said first measurement pattern and said second measurement pattern corresponds to a line width of pattern.

13. A mask according to claim 11, wherein said first measurement pattern and said second measurement pattern are isolated patterns.

14. A mask according to claim 11, wherein said first measurement pattern and said second measurement pattern each is a line-and-space pattern.

15. A mask according to claim 11, wherein a line width of said first measurement pattern is different from a line width of said second measurement pattern.

16. A mask according to claim 11, wherein said extraction pattern is used to extract a diamond-shaped image from a superimposed image of said first measurement pattern and said second measurement pattern.

* * * * *